United States Patent [19]

Blonstein et al.

[11] Patent Number: 5,319,724
[45] Date of Patent: * Jun. 7, 1994

[54] APPARATUS AND METHOD FOR COMPRESSING STILL IMAGES

[75] Inventors: Stephen M. Blonstein, San Jose; James D. Allen, Santa Clara; Martin P. Boliek, Palo Alto, all of Calif.

[73] Assignees: Ricoh Corporation, Menlo Park, Calif.; Ricoh Company, Ltd., Tokyo, Japan

[*] Notice: The portion of the term of this patent subsequent to Jul. 7, 2009 has been disclaimed.

[21] Appl. No.: 743,517

[22] Filed: Aug. 9, 1991

Related U.S. Application Data

[63] Continuation-in-part of Ser. No. 511,245, Apr. 19, 1990, Pat. No. 5,129,015.

[51] Int. Cl.$^5$ .......................... G06K 9/36; G06K 9/46; G06K 9/54
[52] U.S. Cl. ........................ 382/56; 382/49; 358/432
[58] Field of Search ............ 382/56, 49, 41, 43, 382/50; 358/133, 136, 432, 433; 364/413.19, 725

[56] References Cited

U.S. PATENT DOCUMENTS

| 4,449,194 | 5/1984 | Wilhelm | 364/725 |
| 4,507,676 | 3/1985 | Dischert et al. | 358/30 |
| 4,835,559 | 5/1989 | Sigel | 358/30 |
| 5,021,891 | 7/1991 | Lee | 358/432 |
| 5,128,758 | 7/1992 | Azadegan et al. | 358/133 |
| 5,129,015 | 7/1992 | Allen et al. | 382/56 |
| 5,155,592 | 10/1992 | Verbiest et al. | 358/133 |

FOREIGN PATENT DOCUMENTS 90110138.6 5/1990 European Pat. Off. ... G06F 15/332

OTHER PUBLICATIONS

Acheroy, M.; *Use of the DCT for the Restoration of an Image Sequence* SPIE vol. 593, Medical Image Processing (1985).
Cooley and Tukey, J. W.; *An Algorithm for (fast) Fourier Series* _Math Comput_, XIX No. 90, pp. 296–301, 1965.
Chen, W., et al.; *A Fast Computational Algorithm for the DCT* IEEE Trans. Commun. vol. COM-25 (1977).
Wu, H. R. and Paolini, F. J.; *On the Two Dimensional Split-Radix FFT* IEEE Conf. on Image Processing, vol. I(1989), pp. 1302–1304.
Lee, B. C.; *A Fast Cosine Transform* IEEE ASSP vol. XXXIII(1985).
Jalali and Rao; *Limited Wordlength and FDCT Processing Accuracy* IEEE ASSP-81, vol. III, pp. 1180–1182.
Wu, H. R. and Paoline, F. J.; *A Structural Approach to Two Dimensional Direct Fast Discrete Cosine Transform Algorithms* International Symposium on Computer Architecture and Digital Signal Processing, Hong Kong, Oct. 1989.
Wang, Z.; *Reconsideration of a Fast Computational Algorithm for the Discrete Cosine Transform* IEEE Trans. Commun., vol. COM-31 (1983).
Ming-Ting Sun, Ting-Chung Chen, Albert M. Gottlieb, *VLSI Implementation of a 16×16 Discrete Cosine Transform* IEEE Transactions on Circuits and Systems, vol. 36, No. 4 (Apr., 1989).

*Primary Examiner*—Leo H. Boudreau
*Assistant Examiner*—Michael Cammarata

[57] ABSTRACT

Transforms such as the DCT are useful for image compression. One close relative of the DCT is preferred for its arithmetic simplicity. A method and apparatus is described whereby the image compression is done with no multiplications while still compatible with a JPEG (Joint Photographic Experts Group) Transform. Other enhancements are made to improve image quality.

7 Claims, 12 Drawing Sheets

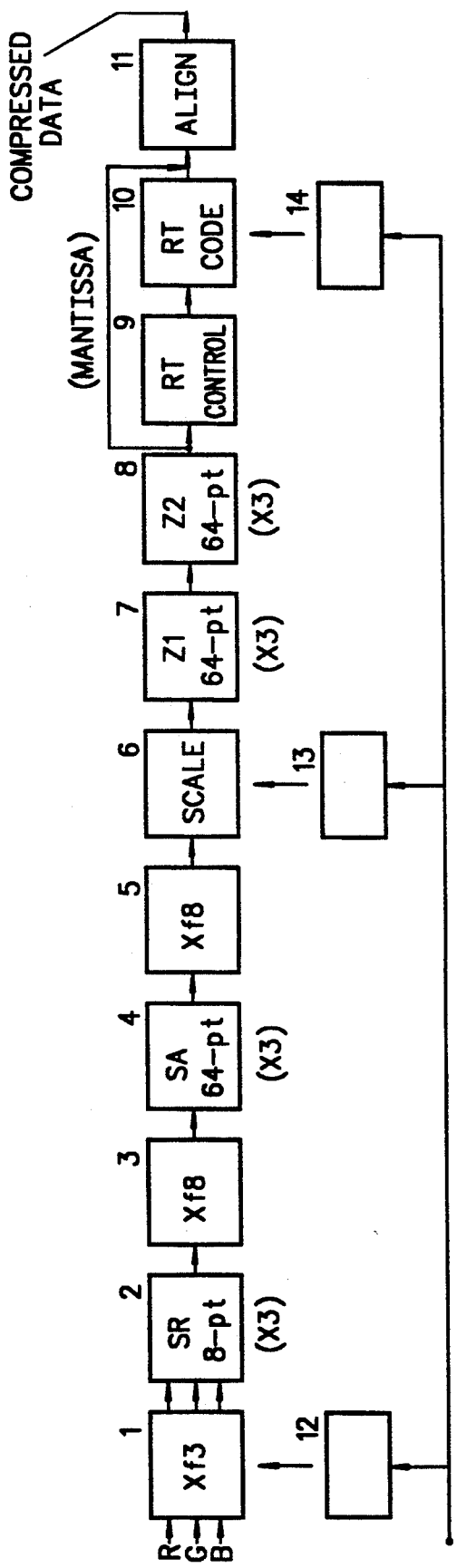
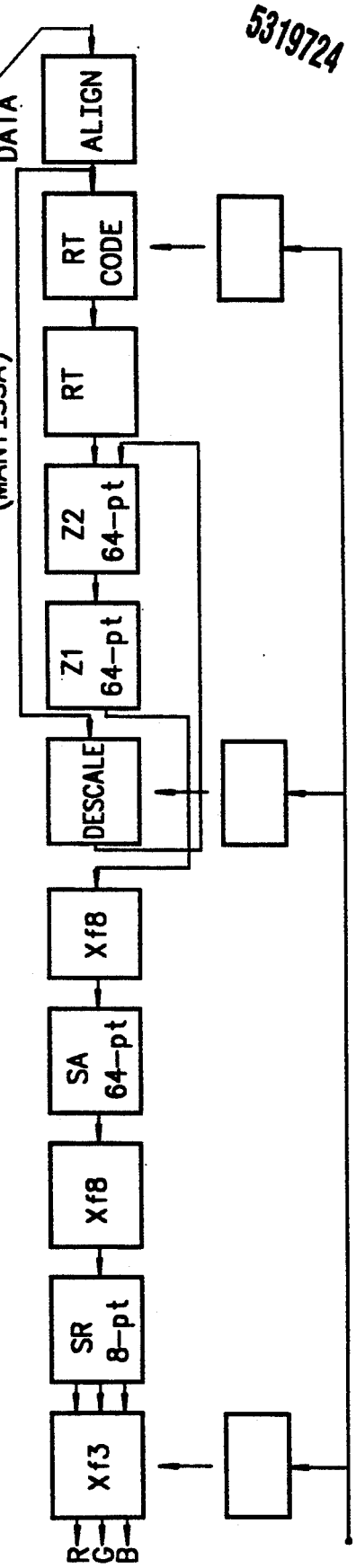
FIG. 1A COMPRESSOR
FIG. 1B DECOMPRESSOR

INPUT PIXEL ORDERING

BLOCK TIMING

VECTOR TIMING

FIG. 3B  3-POINT TRANSFORM, RGB→XYZ

VSLI LAYOUT

SHIFT REGISTER

SHIFT ARRAY

COMBINED DATA FLOW

FORWARD ADD ARRAY

FORWARD ADD ARRAY

APPARATUS AND METHOD FOR COMPRESSING STILL IMAGES

CROSS-REFERENCE TO RELATED APPLICATION

The present application is a continuation-in-part of U.S. pending application Ser. No. 07/511,245, filed Apr. 19, 1990, now U.S. Pat. No. 5,129,015 entitled An Apparatus and Method for Compressing Still Images and priority is claimed thereunder.

BACKGROUND OF THE INVENTION

The invention relates to an apparatus and Corresponding method for compressing still images which is compatible with a JPEG (Joint Photographic Experts Group) Still Image Compression Standard.

When high-quality images must be compressed to save memory or transmission requirements, it is common practice to first transmute the images to another space where the information can be represented more compactly. This is usually done block-by-block with a linear transformation (matrix multiplication); a typical arrangement is to perform 8-point transforms on row segments of 8 pixels and then to perform 8-point transforms on the 8-element column segments of this row-transformed image. Equivalently a single 64-point transform can be performed on a pixel block of 64 pixels arranged in an 8-by-8 block. A good choice for a one dimensional transform is the discrete Chebychev transform:

$$F(u) = c(u) * \sum_{i=0}^{7} f(i) * \cos u(2i + 1)\pi/16$$

where $$C(u) = \begin{cases} \sqrt{2}/8 & \text{for } u = o \\ 2/8 & \text{otherwise} \end{cases}$$

There are several advantages of this transform including a) the compression is near-optimal by some measures, b) there are fast computational algorithms for performing this transform and its inverse, and c) deblurring (enhancement of the initial image) can be readily performed in the transform space, given certain assumptions described in Reference [1].

SUMMARY OF THE INVENTION

It is an object of the present invention to provide an apparatus and corresponding method for compressing still images.

It is a more particular object to provide an apparatus and corresponding method for compressing still images while still compatible with a JPEG Transform.

Additional objects, advantages and novel features of the present invention will be set forth in part in the description which follows and in part become apparent to those skilled in the art upon examination of the following, or may be learned by practice of the invention. The objects and advantages of the present invention may be realized and attained by means of the instrumentalities and combinations which are pointed out in the appended claims.

BRIEF DESCRIPTION OF THE DRAWINGS

The accompanying drawings which are incorporated in and form a part of this specification illustrate an embodiment of the invention and, together with the description, serve to explain the principles of the invention.

FIG. 1A shows a block diagram of a compressor, and FIG. 1B shows a block diagram of a decompressor, according to the present invention.

FIG. 3a-3b shows a three-point transform of RGB to XYZ data.

THEORETICAL DISCUSSION OF THE INVENTION

Figure 2A:
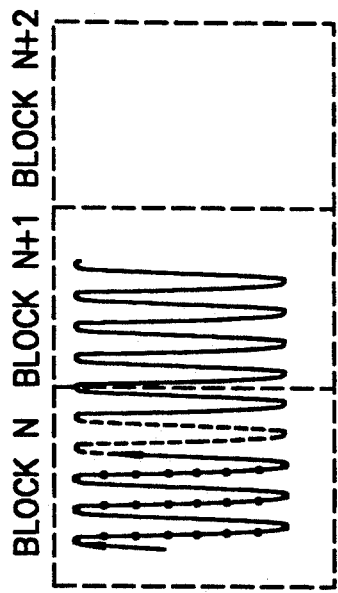
FIGS. 2A-2C show input pixel ordering, block timing and vector timing of data according to the present invention.

A complete system for the compression and reconstruction of images may appear as follows in Table 1.

TABLE 1

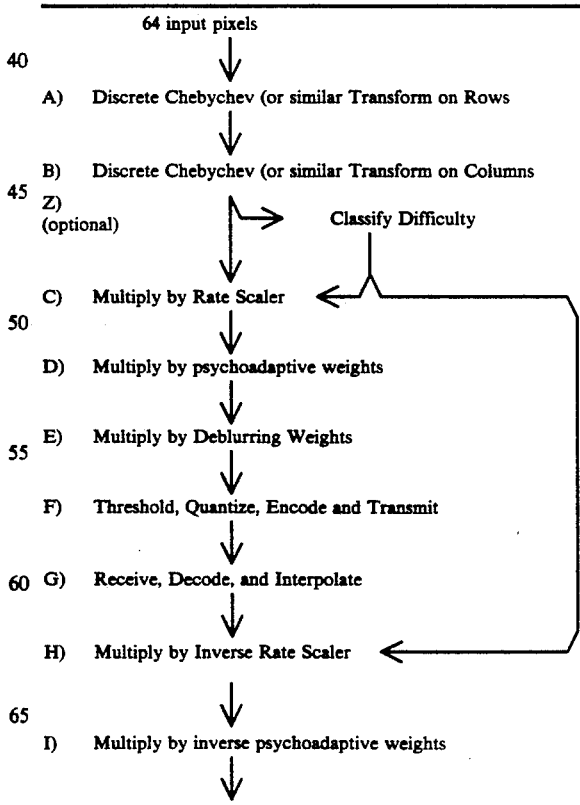

TABLE 1-continued

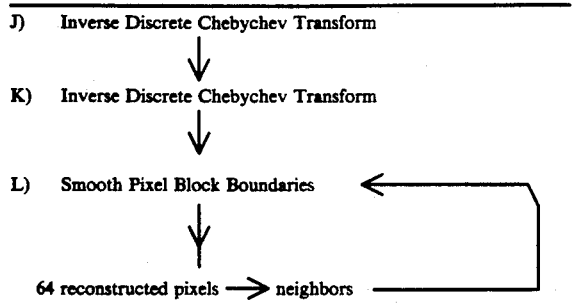

J) Inverse Discrete Chebychev Transform
↓
K) Inverse Discrete Chebychev Transform
↓
L) Smooth Pixel Block Boundaries ←
↓
64 reconstructed pixels → neighbors Table 1 above describes the invention and, with optional steps (L,Z) omitted, current technology as well.

The multiplication by the deblurring weights (step E) can also be performed as a decode step (e.g., after step I).

The deblurring is done to compensate for the point-spread function of the input device. It must be tuned to the device or omitted when the input image has already been enhanced. There are other better ways to deblur the image, but the method shown here is computationally cheap and is appropriate in some applications, e.g. color copier.

It is possible to arrange the computation of the forward transform (A,B) so that much of the computational workload consists of a final multiply stage. By precomputing the products of these multipliers and those in steps (CE) the compression process can be expedited.

Similarly it is possible to arrange the computation of the inverse transform (J,R) so that much of the computation workload consists of a preliminary multiply stage. Again by precomputation of the products, the computational effort of steps (H,I) is effectively eliminated.

Furthermore another transform is substituted for the 2-D DCT transform, yielding further computational simplicity.

Furthermore the psychoadaptive weights can be selectively varied to make the combined multipliers for steps (BD) computationally efficient, e.g. powers of two. Small changes in the psychoadaptive weights of the low-energy output transform elements have little effect on image quality or compression rate.

Finally, attention is called to the steps (L,Z) in FIG. 1, Classification of Image Difficulty and Smoothing Block Boundaries. Since these are optional and independent of the primary invention, they are given minimal discussion in this paper.

Chen Algorithm

The one dimensional Chen algorithm [3] states that $$X = 2/_N A_N x \qquad (1)$$

where x is a data vector, X is a transformed vector, and $A_N$ is the following $$A_n = c(k) \cos((2j+1)k\pi/2N); \; j, \; k=0,1,2,\ldots,N-1.$$

ps Further, $A_n$ can be decomposed in the following manner $$A_N = Z_N \begin{vmatrix} A_{N/2} & 0 \\ 0 & R_{N/2} \end{vmatrix} B_N \qquad (2)$$

where $R_{N/2}$ is the following $$R_{N/2} = c(2k+1) \cos((2j+1)(2k+1)\pi/2N); \; j,$$
$$k=0,1,2,\ldots,N/2-1. \qquad (3)$$

Note that the matrix, Z, is Chen's matrix, P. The notation has been changed to avoid confusion with the matrix, P, in the present application.

Eight Point (N=8) 1D Chen Transform Example

To do an eight point the Chen algorithm, equation 2, is used twice recursively. The first iteration uses the matrices $Z_8$, $R_4$, and $B_8$. The second iteration solves for $A_4$ and uses the matrices $Z_4$, $R_2$, $A_2$, and $B_4$. These are easily derived from the above equations or the Chen paper [3].

$$A_8 = Z_8 \begin{vmatrix} Z_4 \begin{vmatrix} A_2 & 0 \\ 0 & R_2 \end{vmatrix} & \begin{vmatrix} B_4 & 0 \\ 0 & R_4 \end{vmatrix} \end{vmatrix} B_8$$

where $$Z_8 = \begin{vmatrix} 1 & 0 & 0 & 0 & 0 & 0 & 0 & 0 \\ 0 & 0 & 0 & 0 & 1 & 0 & 0 & 0 \\ 0 & 1 & 0 & 0 & 0 & 0 & 0 & 0 \\ 0 & 0 & 0 & 0 & 0 & 1 & 0 & 0 \\ 0 & 0 & 1 & 0 & 0 & 0 & 0 & 0 \\ 0 & 0 & 0 & 0 & 0 & 0 & 1 & 0 \\ 0 & 0 & 0 & 1 & 0 & 0 & 0 & 0 \\ 0 & 0 & 0 & 0 & 0 & 0 & 0 & 1 \end{vmatrix}$$

$$B_8 = \begin{vmatrix} 1 & 0 & 0 & 0 & 0 & 0 & 0 & 1 \\ 0 & 1 & 0 & 0 & 0 & 0 & 1 & 0 \\ 0 & 0 & 1 & 0 & 0 & 1 & 0 & 0 \\ 0 & 0 & 0 & 1 & 1 & 0 & 0 & 0 \\ 0 & 0 & 0 & 1 & -1 & 0 & 0 & 0 \\ 0 & 0 & 1 & 0 & 0 & -1 & 0 & 0 \\ 0 & 1 & 0 & 0 & 0 & 0 & -1 & 0 \\ 1 & 0 & 0 & 0 & 0 & 0 & 0 & -1 \end{vmatrix}$$

$$R_4 = \begin{vmatrix} C1 & C3 & C5 & C7 \\ C3 & -C7 & -C1 & -C5 \\ C5 & -C1 & C7 & C3 \\ C7 & -C5 & C3 & -C1 \end{vmatrix} = \begin{vmatrix} C1 & C4(C7+C1) & C4(C1-C7) & C7 \\ C3 & C4(C5-C3) & -C4(C3+C5) & -C5 \\ C5 & -C4(C5+C3) & C4(C3-C5) & C3 \\ C7 & C4(C7-C1) & C4(C1+C7) & -C1 \end{vmatrix}$$

$$= \begin{vmatrix} C1 & 0 & C7 & 0 \\ 0 & C3 & 0 & C5 \\ 0 & C5 & 0 & -C3 \\ C7 & 0 & -C1 & 0 \end{vmatrix} \begin{vmatrix} 1 & 1 & 0 & 0 \\ 1 & -1 & 0 & 0 \\ 0 & 0 & 1 & 1 \\ 0 & 0 & 1 & -1 \end{vmatrix} \begin{vmatrix} 1 & 0 & 0 & 0 \\ 0 & C4 & 0 & 0 \\ 0 & 0 & C4 & 0 \\ 0 & 0 & 0 & 1 \end{vmatrix} \begin{vmatrix} 1 & 0 & 0 & 0 \\ 0 & 1 & 1 & 0 \\ 0 & 1 & -1 & 0 \\ 0 & 0 & 0 & -1 \end{vmatrix}$$

$$= RA_4 \; RB_4 \; RC_4 \; RD_4$$

$$Z_4 = \begin{vmatrix} 1 & 0 & 0 & 0 \\ 0 & 0 & 1 & 0 \\ 0 & 1 & 0 & 0 \\ 0 & 0 & 0 & 1 \end{vmatrix}$$

$$B_4 = \begin{vmatrix} 1 & 0 & 0 & 1 \\ 0 & 1 & 1 & 0 \\ 0 & 1 & -1 & 0 \\ 1 & 0 & 0 & -1 \end{vmatrix}$$

$$R_2 = \begin{vmatrix} C2 & C6 \\ C6 & -C2 \end{vmatrix}$$

$$A_2 = \begin{vmatrix} 1/\sqrt{2} & 1/\sqrt{2} \\ 1/\sqrt{2} & -1/\sqrt{2} \end{vmatrix}$$

where, from equation 3, $$Cn = \cos(n\pi/16).$$

Chen-Wu (modified) or Parametrized Transform

Thus far all that has been done is the Chen transform. One could multiply it out and realized a computational savings over a brute force, multiply intensive DCT implementation. This is not what applicant has provided, however. To reduce the number of multiplications to the bare minimum, the matrices are reparametrized to the following. This is what applicant calls the Chen-Wu (modified), which is applicant's creation.

$a = C1/C7 = \cos(\pi/16)/\cos(7\pi/16) = \tan(7\pi/16),$ $b = C2/C6 = \tan(6\pi/16),$ $c = C3/C5 = \tan(5\pi/16),$ $r = C4 = \cos(4\pi/16).$  (4)

Note that the diagonal matrix, $RF_4$, contains the normalization factors of the unparametrized matrix, $RA_4$. Also note that a diagonal matrix can be made of the constants in $R_2$ and $A_2$.

Upon reconstruction of the $A_8$ matrix two matrices are kept distinct. The diagonal matrices are kept separate from the main matrix. The main matrix is multiplied $$R_4 = \begin{vmatrix} a & r(1+a) & r(a-1) & 1 \\ c & r(1-c) & -r(1+c) & -1 \\ 1 & -r(1+c) & r(c-1) & c \\ 1 & r(1-a) & r(a+1) & -a \end{vmatrix} \begin{vmatrix} 1\sqrt{(a^2+1)} & 0 & 0 & 0 \\ 0 & 1/\sqrt{(c^2+1)} & 0 & 0 \\ 0 & 0 & 1/\sqrt{(c^2+1)} & 0 \\ 0 & 0 & 0 & 1/\sqrt{(a^2+1)} \end{vmatrix}$$

$$= RE_4 \; RF_4$$

$$R_2 = 1\sqrt{(b^2+1)} \begin{vmatrix} b & 1 \\ 1 & -b \end{vmatrix}$$

$$A_2 = 1/\sqrt{2} \begin{vmatrix} 1 & 1 \\ 1 & -1 \end{vmatrix}$$

where by the $B_N$ terms. After the appropriate reordering and multiplication by the constant term, equation 1 reduces to the following.

$$X = Q(a, b, c) P(a, b, c, r) x$$

where $$Q(a, b, c) = \begin{vmatrix} 1/2\sqrt{2} & 0 & 0 & 0 & 0 & 0 & 0 & 0 \\ 0 & 1/2\sqrt{(a^2+1)} & 0 & 0 & 0 & 0 & 0 & 0 \\ 0 & 0 & 1/2\sqrt{(b^2+1)} & 0 & 0 & 0 & 0 & 0 \\ 0 & 0 & 0 & 1/2\sqrt{(c^2+1)} & 0 & 0 & 0 & 0 \\ 0 & 0 & 0 & 0 & 1/2\sqrt{2} & 0 & 0 & 0 \\ 0 & 0 & 0 & 0 & 0 & 1/2\sqrt{(c^2+1)} & 0 & 0 \\ 0 & 0 & 0 & 0 & 0 & 0 & 1/2\sqrt{(b^2+1)} & 0 \\ 0 & 0 & 0 & 0 & 0 & 0 & 0 & 1/2\sqrt{(a^2+1)} \end{vmatrix}$$ (5)

$$P(a, b, c, r) = \begin{vmatrix} 1 & 1 & 1 & 1 & 1 & 1 & 1 & 1 \\ a & r(a+1) & r(a-1) & 1 & -1 & r(1-a) & -r(a+1) & -1 \\ b & 1 & -1 & -b & -b & -1 & 1 & b \\ c & r(1-c) & -r(c+1) & -1 & 1 & r(c+1) & r(c-1) & -c \\ 1 & -1 & -1 & 1 & 1 & -1 & -1 & 1 \\ 1 & -r(c+1) & r(c-1) & c & -c & r(1-c) & r(c+1) & -1 \\ 1 & -b & b & -1 & -1 & b & -b & 1 \\ 1 & r(1-a) & r(a+1) & -a & a & -r(a+1) & r(1-a) & -1 \end{vmatrix}$$ (6)

Generalized Transform

The Generalized 8-point DCT transform is determined by four parameters a, b, c, and r and can be written as $$T(a,b,c,r) = p(a,b,c,r) \times Q(a,b,c)$$

where P() and Q() are as above.

The image transformation requires two such transforms T, namely Tv and Th, to transform the image vertically and horizontally respectively. The complete two-dimensional transform is represented by $$[F] = [T_v] [f]^t [T_h]$$

where f is the input image block, F is the output transform coefficients, and the superscript "t" denotes matrix transposition. Here all matrices are 8 by 8.

Since a diagonal matrix (such as Q) is its own transpose, and $$[A]^t [B]^t = ([B]^t [A])$$

for all matrices, and $$[T_v] = [F_v] [Q 1_v],$$

$$[T_h 1] = [P_h] [Q_h],$$

we can write $$[F] = [Q_v] [P_v]][f] [P_h] [Q_h]$$

which reduces to $$F(i,j) = q(i,j) * (g(i,j))$$

where $$[g] = [F_v] [f] [P_h']$$

and $$q(i,j) = Q_v(i,i) * Q_h(j,j)$$ (7)

When transforming an image block, we shall solve for [g] using the Chen-Wu algorithm and then multiply by the factors q(i,j). Given $$P_v = P(a, b, c, r_v)$$

and $$P_h = P(a, b, c, r_h)$$

the inverse of the above transformation is expressed by $$[f] = [P'_v] [Q_v] [F] [Q_h] [P'_h]$$

where $$P'_v = P(a, b, c, 1/2r_v)$$

and $$P'_h = P(a, b, c, 1/2r_h)$$

Again solution is via the Chen-Wu algorithm.

Chen's Algorithm

Several methods have been devised to speed up the computation of the 1-D or 2-D Chebychev Transforms and their inverses.

There is a well-known algorithm (Chen) [2,3] which multiplies an arbitrary 8-tuple by the matrix T above using only 16 multiples, 13 additions and 13 subtractions. This algorithm does not rely on any special properties of the parameters a, b, c and r.

Chen-Wu Algorithm (Modified)

By factoring [T]=[P] [Q] as above, Chen's algorithm is split into two stages, with 8 multiplies used in the multiplication by [Q], 8 multiplies and the rest of the arithmetic used in the multiplication by [P]. This is a consequence of our choice for [Q]; several elements of [P] become 1 or −1 and a multiplication vanishes.

As indicated above, similar simplications apply to the inverse transform, the 2-D transform, and the inverse 2-D transform. For 8-by-8 blocks, 128 multiplies are used for either the forward or reverse 2-D transform (excluding the multiplies by [q]). When the internal dataflow of Chen's algorithm is viewed, these multiplies are embedded in a structure of eight add/subtract stages and four multiply stages.

It is important to stress that the Chen algorithm operates regardless of the parameters a, b, c and r. However the 8-point DCT employed in prior art has the parameters of the "true cosine transform":

$$a = \tan(7 \cdot pi/16)$$
$$b = \tan(6 \cdot pi/16)$$
$$c = \tan(5 \cdot pi/16)$$
$$r = \sqrt{1/2} = 0.70710678\ldots$$

with the choice of r necessary and sufficient for matrix T to be orthogonal.

Choice of Parameter Values

The Chen transform works regardless of the values selected for parameters a, b, c, and r. This is because the transform created by QP is orthogonal. It is completely possible to use any numbers and have a transform that will perform the desired decorrelation of the image data necessary for compression. Note that this transform is not a Discrete Cosine Transform nor is it an approximation of a DCT. It is its own transform.

However, for efficient decorrelation of the input image, and for transformation into relatively meaningful spatial frequency coefficients, it is generally agreed that the DCT is very desirable [5]. Thus, to achieve the benefits of the DCT the parameters are set to approximate those of the DCT given in equation 4. The opposing factor is efficiency of computation. Since an add is cheaper than a multiply (in hardware the savings is silicon real estate, in software it is number of cycles) the parameters are chosen to be computationaly efficient.

Alternative Algorithms

Other computational solutions have been devised for the Discrete Chebychev Transform. For example an algorithm due to Lee performs the 8-point 1D and the 64-point 2D transforms with 12 and 144 multiplies respectively [4,5].

However there are several disadvantages of these "faster" algorithms compared with the Chen algorithm:
a) The simplication T=P×Q (and the similar factoring for the reverse transform) is no longer operative. Separating the diagonal matrix Q is essential for the simplifications which follow.
b) These algorithms do not function with arbitrary parameters a, b, c and r. Instead they rely on various trigonometric identities valid specifically for the true cosine parameters.
c) These algorithms have a more difficult structure. This can impede engineering and increase the potential for numeric instability.

Discussion of the Invention

A] Referring again to Table 1, it will be noted that steps (C,D,E) can be folded into the forward transform post-multipliers derived from [Q]. Similarly the steps (H,I) can be folded into the inverse transform pre-multipliers. This is because the rate scalar operation, psychoadaptive weights operation (commonly known as quantization values), and deblurring weights operation are all point multiply operations. If b, c, d, e are the outputs of steps B, C, D, E respectively then $$c(i,j) = b(i,j) * q(i,j)$$

$$d(i,j) = c(i,j) * r(i,j) = b(i,j) * q(i,j) * r(i,j)$$

$$e(i,j) = d(i,j) * u(i,j) = b(i,j) * q(i,j) * r(i,j) * u(i,j)$$

or $$e(i,j) = b(i,j) * alI(i,j)$$

where $$alI(i,j) = q(i,j) * r(i,j) * u(i,j) \quad (8)$$

and q(i,j) is the rate scalar, r(i,j) are psychoadaptively chosen (or even user chosen) quantization weights, and u(i,j) are deblurring weights.

Similarly steps H and I can be combined.

This effectively means that the rate scaling, adaptive weighting and deblurring functions are provided with no additional computational overhead. As noted above, this approach is not applicable with the "faster" algorithms like Lee's.

B] Since Chen's algorithm operates with any parameters a, b, c and r, we will choose values which offer quality and compression similar to the DCT but which lead to high-speed multiplication.

The following parameters are reasonably close to those of the DCT but much more efficient computationally:

$$a = 5.0$$
$$b = 2.5$$
$$c = 1.5$$
$$r = 0.75$$

Multiplication is now replaced with much simpler arithmetic. Multiply-by-5 for example becomes copy;-shift-left-2;add. Multiply by 1.5 becomes copy;shift-right-1;add.

Alternatively, the inverse numerator of a rational multiplier can be factored into the combined multiplier [q]. Thus the multiply by 2.5 can become multiplies by 5 and 2 for affected and unaffected terms respectively.

With this latter idea, handling of parameter r=0.75 in the straightforward Chen algorithm requires 96 multiplies by 4 and 32 multiplies by 3. With the Wu-Paolini in a 2D implementation improvement an entire multiply stage is eliminated and this becomes 36 multiplies by 16, 24 multiplies by 12, and 4 multiplies by 9. (The inverse transform uses 36 multiplies by 9, 24 multiplies by 6, and 4 multiplies by 4.)

For a cost of computational speed, parameter values even closer to the cosine transform can be selected. The substitutions b=12/5 and/or r=17/24 are possible. Another interesting alternative is:

$rRow = 0.708333$ (17/24)
$rCol = 0.7$ (7/10)

Here slightly different transforms (different parameter r) are used for the row and columns. This is done to simplify the multipliers derived in the Wu-Paolini method. Here that method yields 36 multiplies by 15, 12 multiplies by 85/8, 12 multiplies by 21/2 and 4 multiplies by 119/16. (The inverse transform uses 36 multiplies by 119/16, 12 multiplies by 85/16, 12 multiplies by 21/4, and 4 multiplies by 15/4.)

In the fashion just described all multiplies have been rendered fast and inexpensive except for the combined multiplier [q] in the compressor and the combined multiplier [q] in the decompressor. Each of these requires one multiply per transform element. The latter is simplified in that the majority of transform coefficients will be zero, and most of the non-zero coefficients will be integers quite close to zero which can be specially handled.

C] A further technique is used to reduce the computational cost of the combined [q] multiplier in the compressor. Since the rate scaler is actually an arbitrary value, it will be adjusted point-by-point to give all of the [q] matrix elements computationally simple values, e.g. powers-or-two. These 64 adjustments need to be performed only once (after the rate scaler and deblurring filters are specified).

For example, if an element (C) of the combined multiplier and the corresponding decompression multiplier element (D) happen to be $C = 0.002773$ $D = 0.009367$ the proximity $C \sim = 3 / 1024 = 0.002930$ might be found and used to simplify the multiplication. This gives $C' = 3 / 1024$ $D' = D * C / C' \sim = 0.008866$

DETAILED DESCRIPTION OF THE (PRIMARY) PROCESS

Notes a) In the quantized transform space, it is convenient and efficacious to take the non-zero steps of the "AC" coefficient quantization to be of constant width (w), and to take the zero step to be of width (w*q).

Moreover, q=2 is arithmetically convenient and is near-optimal for quality across a broad range of compression factors. In the description we take=2 ("double-width zero"), although the invention comprises any possible q.

b) The following algorithm is designed for limited-precision two's-complement binary integer arithmetic except for the intermediate determinations in steps (2), (4) and (8) which are done once with high precision arithmetic.

Furthermore, and with the additional exception of step (9.1) the integer multiplies described here are optimized for cost and speed. For example consider the multiplies by $Nrr * Nrc = Drr' * Drc' = 1.75 * 4.25 = 7.4375$ By choosing the identity $7.4375 = (8-1) * (1+1/16)$ the multiplication is done efficiently with shifts and adds.

c) The deblurring multiplies are shown here in step 8 but they should usually be done in step 4, if at all. In many applications, the decompressor does not "know" how or whether to deblur the image. Note that the best values of Thr() depend on the input device and deblurring method.

A recommended approach is for the value m(i,j) (see step 8) to be calculated a compression time (step 4) and transmitted or stored as part of the compressed image.

d) There are several obvious ways to parallelize, time-sequence or interleave the computations which follow. The preferred method for a given hardware architecture is straightforward.

Example Pseudo Code Embodiment

This part of the application is essentially an embodiment of the invention explained in text and pseudocode. There are several sections, including parametrization, calculation of all(i,j) as in equation 8 above, execution of the main body of the forward GCT, calculation of the inverse all(i,j), execution of the main body of the inverse GCT.

1. The parameters a, b, c, and r are shown on above. Notice that there is an r value for both rows and columns. Although the 2D GCT is a separable transform and can be executed in two passes, there is no restriction that requires it to be symmetric. Therefore, the scaling factors can be asymmetric as shown.

The equations for the numerators N and denominators D show possible combinations of numerator and denominator that can equal the above values. The designer of the GCT implementation has leeway in the actual values used in the adder array. The choices of values are corrected for at the final multiplication stage.

Choose $\tan 7*pi/16 \sim = a = Na / Da$ $\tan 6*pi/16 \sim = b = Nb / Db$ $\tan 5*pi/16 \sim = c = Nc / Dc$ $sqrt(0.5) \sim = rRow = Nrr / Drr$ $sqrt(0.5) \sim = rCol = Nr / Drc$ $0.5 / rRow = rRow' = Nrr'/Drr'$ $0.5 / rCol = rCol' = Nrc40 / Drc'$.

as the parameters of the Generalized Chen Transform as discussed above. The "numerators" N and "denominators" D need not be integral, though they will be chosen for computational convenience. Among several useful possibilities is:

| | |
|---|---|
| $Na = 5$ | $Da = 1$ |
| $Nb = 3$ | $Db = 1.25$ |
| $Nc = 1.5$ | $Dc = 1$ |
| $Nrr = 1.75$ | $Drr = 2.5$ |
| $Nrc = 4.25$ | $Drc = 6$ |
| $Nrr' = 1.25$ | $Drr' = 1.75$ |
| $Nrc' = 3$ | $Drc' = 4.25$ | but again, the invention comprises all rational approximations to the above tangents.

This calculates the normalization scalers needed.

2. Also write $$U(0) = U(4) = sqrt(0.5)$$

$$U(1) = U(7) = 1/sqrt(Na*Na + Da*Da)$$

$$U(2) = U(6) = 1/sqrt(Nb*Nb + Db*Db)$$

$$U(3) = U(5) = 1/sqrt(Nc*Nc + Dc*Dc)$$

3. Let i be an index on $\{0,1,2,3,4,5,6,7\}$ denoting vertical position (in the image space) or sequence of vertical change (in the transform space)

j be an index on $\{0,1,2,3,4,5,6,7\}$ denoting horizontal position (in the image space) or sequence of horizontal change (in the transform space)

Debl(i,j) denote the deblurring factors, or Debl() = 1 when not deblurring.

Thr(i,j) denote the inverse psychoadaptive weights, e.g. as recommended by the CCITT.

M denote the rate scaler; here M = 1 (approx) for typical compression rates.

v(i,j) denote the several luminance values in the image (spatial) space.

L(i,j) denote the transformed luminance values in the transform (compressed) space.

S be an arbitrary small integer denoting the arithmetic precision used in the reconstruction.

The psychoadaptive weights 1 / Thr(i,j) should be reoptimized for each set of parameters of the Generalized Chen Transform. However the parameters given in step (1) above are sufficiently close to the CCITT parameters that the same matrix Thr() is optimal.

4. Here g(i,j) is equivalent to all(i,j). Iterate through the 64 transform locations (i,j), solving for k(i,j) and s(i,j) to satisfy:

$$g(i,j) < \frac{2 * M * U(i) * U(j)}{k(i,j) * Zr(i) * Zc(j) * Thr(i,j)}$$

with the right-side as close to g(i,j) as possible, s(i,j) an integer, and where $$g(i,j) = 1.0, \ k(i,j) \text{ in } \{1,3,5,7,9\}$$

for i+j < 4

$$g(i,j) = 0.9, \ k(i,j) \text{ in } \{1,3,5\}$$

for i+j < 4

$$g(i,j) = 0.7, \ k(i,j) = 1$$

for i+j < 4

| | |
|---|---|
| $Zr(i) = 1$, | when $i = 0, 1, 2$ or 3 |
| $Zr(i) = Drr$, | when $i = 4, 5, 6$ or 7 |
| $Zc(j) = 1$, | when $j = 0, 1, 2$ or 3 |
| $Zc(j) = Drc$, | when $j = 4, 5, 6$ or 7 |
| $Zr'(i) = 1$, | when $i = 0, 1, 2$ or 3 |
| $Zr'(i) = Drr'$, | when $i = 4, 5, 6$ or 7 |
| $Zc'(j) = 1$, | when $j = 0, 1, 2$ or 3 |
| $Zc'(j) = Drc$, | when $j = 4, 5, 6$ or 7 |

The factors g(i,j) are intended to make the quantization bias independent of the choice size.

5. Execution of the Forward GCT

Step 5 is the pseudocode execution of the forward transform. The following steps perform a 2D transform in an interleaved form.

Iterate through the image performing the following on each eight-by-eight block of luminance values v(,):

5.1 Prepare the values $$M(i, 0) = V(i, 0) + V(i,7)$$

$$M(i, 1) = V(i, 1) + V(i,6)$$

$$M(i, 2) = V(i, 2) + V(i,5)$$

$$M(i, 3) = V(i, 3) + V(i,4)$$

$$M(i, 4) = V(i, 3) - V(i,4)$$

$$M5(i) = V(i, 2) - V(i, 5)$$

$$M6(i) = V(i, 1) - V(i, 6)$$

$$M(i, 5) = M6(i) + M5(i)$$

$$M(i, 6) = M6(i) - M5(i)$$

$$M(i, 7) = v(i, 0) - v(i,7)$$

for i = 0, 1, 2, ..., 7

5.2 Prepare the values $$H(0, j) = M(0, j) + M(7, j)$$

$$H(1, j) = M(1, j) + M(6, j)$$

$$H(2, j) = M(2, j) + M(5, j)$$

$$H(3, j) = M(3, j) + M(4, j)$$

$$H(4, j) = M(3, j) - M(4, j)$$

$$H5(j) = M(2, j) - M(5, j)$$

$$H6(j) = M(1, j) - M(6, j)$$

$$H(5, j) = H6(j) + H5(j)$$

$$H(6, j) = H6(j) - H5(j)$$

$$H(7, j) = M(0, j) - M(7, j)$$

for j = 0, 1, 2, ..., 7

5.3 Multiply each H(i,j) by (if i = 0, 2, 3 or 4:)

| | |
|---|---|
| Nrc | if j = 5 or 6 |
| Drc | if j = 4 or 7 |
| 1 (no action) | if j = 0, 1, 2 or 3 |

(if i=4 or 7:)

$Drr\ Nrc$ if $j = 5$ or $6$
$Drr\ Drc$ if $j = 4$ or $7$
$Drr$ if $j = 0, 1, 2$ or $3$ (if i=5 or 6:)

$Nrr\ Nrc$ if $j = 5$ or $6$
$Nrr\ Drc$ if $j = 4$ or $7$
$Nrr$ if $j = 0, 1, 2$ or $3$ 5.4 Prepare the values $E(0, j) = H(0,j) + H(3,j)$ $E(1, j) = H(7,j) + H(5,j)$ $E(2, j) = H(0,j) - H(3,j)$ $E(3, j) = H(7,j) - H(5,j)$ $E(4, j) = H(1,j) + H(2,j)$ $E(5, j) = H(6,j) - H(4,j)$ $E(6, j) = H(1,j) - H(2,j)$ $E(7, j) = H(6,j) + H(4,j)$ $F(0, j) = E(4, j) + E(0, j)$ $F(4, j) = E(0, j) - E(4, j)$ $F(2, j) = Db * E(6,j) + Nb * E(2, j)$ $F(6, j) = Db * E(2,j) - Nb * E(6, j)$ $F(1, j) = Da * E(7,j) + Na * E(b\ 1, j)$ $F(7, j) = Da * E(1,j) - Na * E(7, j)$ $F(3, j) = Dc * E(5,j) + Nc * E(3, j)$ $F(5, j) = Dc * E(3,j) - Nc * E(5, j)$ for j=0,1,2, ..., 7

5.5. Prepare the values $Z(i, 0) = F(i,0) + F(i,e)$ $Z(i, 2) = F(i,0) - F(i,3)$ $Z(i, 4) = F(i,1) + F(i,2)$ $Z(i, 6) = F(i,1) + F(i,2)$ $Z(i, 1) = F(i,7) + F(i,5)$ $Z(i, 3) = F(i,7) - F(i,5)$ $Z(i, 5) = F(i,6) - F(i,4)$ $Z(i, 7) = F(i,6) + F(i,4)$ ti $G(i, 0) = Z(i, 4) + Z(i, 0)$ps
$G(i, 4) = Z(i, 0) - Z(i, 4)$ $G(i, 2) = Db * Z(i,6) + Nb * Z(i, 2)$ $G(i, 6) = Db * Z(i,2) - Nb * Z(i, 6)$ $G(i, 1) = Da * Z(i,7) + Na * Z(i, 1)$ $G(i, 7) = Da * Z(i,1) - Na * Z(i, 7)$ $G(i, 3) = Dc * Z(i,5) + Nc * Z(i, 3)$ $G(i, 5) = Dc * Z(i,3) - Nc * Z(i, 5)$ for i=0,1,2, ..., 7

Figure 8A:
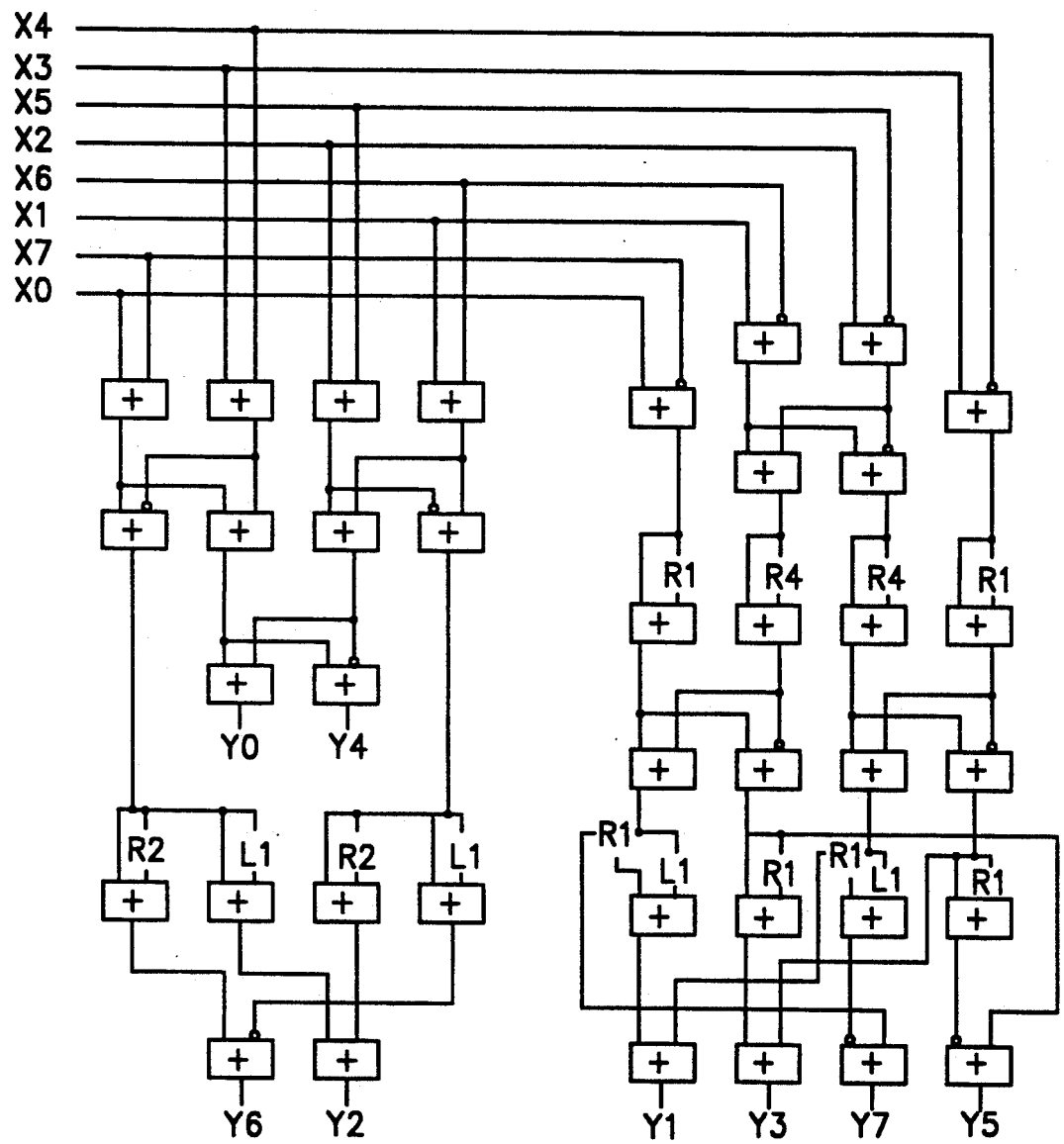
FIGS. 8A and 8B show diagrams of forward add arrays according to the present invention.

Alternatively, the transform can be separated into two passes through a one dimensional transform. The following is an example of a one dimensional transform pass. FIG. 8 shows these steps.

$A1 = X0 + X7$   $B1 = A1 - A2$   $C1 = 1.25\ B1$
$A2 = X3 + X4$   $B2 = A1 + A2$   $C2 = 3\ B1$
$A3 = X2 + X5$   $B3 = A3 + A4$   $C3 = 1.25\ B4$
$A4 = X1 + X6$   $B4 = A4 - A3$   $C4 = 3\ B4$
$A5 = X0 - X7$   $B5 = A6 + A7$   $C5 = 1.5\ A5$
$A6 = X1 - X6$   $B6 = A6 - A7$   $C6 = 1.0625\ B5$
$A7 = X2 - X5$                    $C7 = 1.0625\ B6$
$A8 = X3 - X4$                    $C8 = 1.5\ A8$
$D1 = C5 + C6$   $E1 = 2.5\ D1$   $Y0 = B2 + B3$
$D2 = C5 - C6$   $E2 = 1.25\ D2$  $Y1 = E1 + (0.5\ D3)$
$D3 = C7 + C8$   $E3 = 2.5\ D3$   $Y2 = C2 + C4$
$D4 = C7 - C8$   $E4 = 1.5\ D4$   $Y3 = E2 + D4$
                                  $Y4 = B2 - B3$
                                  $Y5 = D2 - E3$
                                  $Y6 = C1 - C4$
                                  $Y7 = (0.5\ D1) - E4$

Note that all the multiples in these equations are executed with shift and add operations.

To relate this to the matrix form of the GCT, the vector point Y6 is demonstrated as an example.

$Y6 = C1 - C4 = (1.25\ B1) - (3\ B4) =$
$\quad 1.25\ (A1 - A2) - 3\ (A4 - A3)$
$\quad = 1.25\ ((X0 + X7) - (X3 + X4)) -$
$\quad 3\ ((X1 + X6) - (X2 + X5))$
$\quad = 1.25\ X0 - 3\ X1 + 3\ X2 - 1.25\ X3 +$
$\quad 1.25\ X4 + 3\ X5 - 3\ X6 + 1.25\ X7$
$Y6/1.25 = X0 - 2.4\ X1 + 2.4\ X2 - X3 +$
$\quad X4 + 2.4\ X5 - 2.4\ X6 + X7$
$\quad = |1\ -b\ b\ -1\ 1\ b\ -b\ 1\ |\ x$ where b=2.4. This is the sixth row of the matrix P in equation Note that the division by 1.25 is a scaling factor that is collected in the rate scaler matrix.

The row data of an 8×8 pixel block is passed through this adder array. The resulting one dimensional frequency components are transposed and passed through the same array again.

6. After step 5.5 in each image subblock and for each of the 64 locations (i,j), using k(i,j) and s(i,j) from step (4), prepare the value $L(i,j) = G(i,j) * k(i,j) * 2$ but if this is negative (or i=j=0), add 1 to it. This result is the transform coefficient L(i,j).

Comments about Step 6

The calculations here are simple because k(i,j) is always 1, 3, 5, 7 or 9 and is usually 1.
multiplication by $2\ ^{\wedge}(-s(i,j))$ is simply a right-shift. (or perhaps a left-shift if M was chosen very large.)

Arithmetic right-shifts always round downwards. Rounding towards zero is actually desired; hence the clause "if (negative) add 1".

The addition of 1 when $i=j=0$ relies on $v(i,j) >= 0$ and is just a device to simplify the statement of step (9.1) below.

7. Encode, store and/or transmit the values $L(i,j)$. Eventually they will be retrieved and the image reconstructed with the following steps.

8. This is the inverse version of all$(i,j)$. Iterate through the 64 transform locations $(i,j)$, solving for $m(i,j)$ as the nearest integer to $$m(i,j) = \frac{U(i) * U(j) * Zr(i)^2 * Zc(j)^2 * DebK(i,j)}{Zr'(i) * Zc'(j) * k(i,j) * 2^{4-S-s(i,j)}}$$

where $s(i,j)$ and $k(i,j)$ are solved in step (4) above, and where the expressions "Z" are defined in step (4).

Also choose $A(i,j)$ as the nearest integer to $$A(0,0) = \frac{2^{S-2}}{Drc' * Drr'} - 0.5 * m(0,0)$$

$A(i,j) = m(i,j) * (25 - i - j)/64$
for $i = 0$ or $j = 0$

Comments about Step 8

The values $m(i,j)$ may have been precalculated above in step (4) and transmitted with the compressed image. This is not needed for $A(i,j)$ which depend only on constants and $m(i,j)$. In applications where the rate scaler and deblurring weights are fixed the values $m(i,j)$ and $A(i,j)$ will be constant. The factor $2^S$ reflects extra bits of precision which will be subsequently removed by arithmetic right-shifts in steps (9.2) and (10).

The adjustment to $A(0,0)$ corrects a rounding bias to allow use of the outputs below without rounding correction.

As given here, $A(0,0)$ relies on the addition of 1 to $L(0,0)$ in step (6).

The interpolation "$(25-i-j)/64$" is heuristic but is approximately optimal in a mean-squared error sense. Once again, the 2D interleaved version.

9. Iterate through the transformed image performing the following on each eight-by-eight block of transformed luminance values $L(\_,\_)$ as derived in step (5) above:

9.1. Prepare the values $E(i,j) = L(i,j) * m(i,j) + A(i,j)$ for $L(I,j) > 0$ $E(i,j) = L(i,j) * m(i,j) - A(i,j)$ for $L(i,j) < 0$ $E(i,j) = 0$ for $L(i,j) = 0$ for each $(i,j)$, $i=0,1,2,\ldots,7$ and $j=0,1,2,\ldots,7$.

$A(0,0)$ must always be added. The present invention also covers where the test $L(0,0)>0$ is not made and steps (6) and (8) above (optionally) simplified.

In practice, small multiplication, e.g. $-11<L(i,j)<11$ should be recognized as special cases to save the computational expense of a multiply.

9.2 (If convenient to reduce the cost of the semiconductor apparatus, right-shift the numbers $E(i,j)$ by an arbitrary number of positions $S1$. Note that these shifts are "free" in some implementations of the method. In implementations where the shift is not free, we may choose to omit it when $E(i,j)$ is zero. Or we may choose to eliminate all shifts by setting $S1=0$.)

9.3. Once again in the two dimensional form, prepare the values $F(0,j) = E(4,j) + E(0,j)$ $F(4,j) = E(0,j) - E(4,j)$ $F(2,j) = Db * E(6,j) + Nb * E(2,j)$ $F(6,j) = Db * E(2,j) - Nb * E(6,j)$ $F(1,j) = Da * E(7,j) + Na * E(1,j)$ $F(7,j) = Da * E(1,j) - Na * E(7,j)$ $F(3,j) = Dc * E(5,j) + Nc * E(3,j)$ $F(5,j) = Dc * E(3,j) - Nc * E(5,j)$ $H(0,j) = F(0,j) + F(2,j)$ $H(1,j) = F(4,j) + F(6,j)$ $H(2,j) = F(4,j) - F(6,j)$ $H(3,j) = F(0,j) - F(2,j)$ $H(4,j) = F(7,j) - F(5,j)$ $H5(j) = F(7,j) + F(5,j)$ $H6(j) = F(1,j) - F(3,j)$ $H(5,j) = H6(j) + H5(j)$ $H(7,j) = F(1,j) + F(3,j)$ for $j=0,1,2\ldots,7$ 9.4 Prepare the values $G(i, 0) = H(i, 4) + H(i, 0)$ $G(i, 4) = H(i, 0) - H(i, 4)$ $G(i, 2) = Db * H(i, 6) + Nb * H(i, 2)$ $G(i, 6) = Db * H(i, 2) - Nb * H(i, 6)$ $G(i, 1) = Da * H(i, 7) + Na * H(i, 1)$ $G(i, 7) = Da * H(i, 1) - Na * H(i, 7)$ $G(i, 3) = Dc * H(i, 5) + Nc * H(i, 3)$ $G(i, 5) = Dc * H(i, 3) - Nc * H(i, 5)$ $M(i, 0) = G(i, 0) + G(i, 2)$ $M(i, 1) = G(i, 4) + G(i, 6)$ $M(i, 2) = G(i, 4) - G(i, 6)$ $M(i, 3) = G(i, 0) - G(i, 2)$ $$M(i, 4) = G(i, 7) - G(i, 5)$$

$$M5(i) = G(i, 7) + G(i, 5)$$

$$M6(i) = G(i, 1) - G(i, 3)$$

$$M(i, 5) = M6(i) - m5(i)$$

$$M(i, 6) = M6(i) + M5(i)$$

$$M(i, 7) = G(i, 1) + G(i, b\ 3)$$

for i=0,1,2 ..., 7

9.5 Multiply each M(i,j) by (if i=0, 2, 3 or 4:)

| | |
|---|---|
| Nrc' | if j = 5 or 6 |
| Drc' | if j = 4 or 7 |
| 1 (no action) | if j = 0, 1, 2 or 4 |
| (if i = 4 or 7:) | |
| Drr' Nrc' | if j = 5 or 6 |
| Drr' DRC | if j = 4 or 7 |
| Drr' | if j = 0, 1, 2 or 3 |
| (if i = 5 or 6:) | |
| Nrr' Nrc' | if j = 5 or 6 |
| Nrr' Drc' | if j = 4 or 7 |
| Nrr' | if j = 0, 1, 2 or 3 |

9.6. Prepare the values $$Z(i, 0) = M(i, 0) + M(i, 7)$$

$$Z(i, 1) = M(i, 1) + M(i, 6)$$

$$Z(i, 2) = M(i, 2) + M(i, 5)$$

$$Z(i, 3) = M(i, 3) + M(i, 4)$$

$$Z(i, 4)\ M(i, 3) - M(i, 4)$$

$$Z(i, 5) = M(i, 2) - M(i, 5)$$

$$Z(i, 6) = M(i, 1) - M(i, 6)$$

$$Z(i, 7) = M(i, 0) - M(i, 7)$$

for i=0, 1,2 ..., 7

9.7. Prepare the values $$Y(0, j) = Z(0, j) + Z(7, j)$$

$$Y(1, j) = Z(1, j) + Z(6, j)$$

$$Y(2, j) = Z(2, j) + Z(5, j)$$

$$Y(3, j) = Z(3, j) + Z(4, j)$$

$$Y(4, j) = Z(3, j) - Z(4, j)$$

$$Y(5, j) = Z(2, j) - Z(5, j)$$

$$Y(6, j) = Z(1, j) - Z(6, j)$$

$$Y(7, j) = Z(0, j) - Z(7, j)$$

for j=0,1,2, ..., 7

10. After step 9.7 in each image subblock and for each of the 64 locations (i, j), prepare the value $$V(i, j) = Y(i, j) * 2$$

where S and S1 are the arbitrary integers defined in steps (7) and (9.2) above. Again, the multiplication is actually a right-shift.

11. Depending on system particulars it may now be necessary to perform range checking. For example if the admissible range of luminance is $0 <= v(i, j) <= 255$ then values of V(i, j) less than zero or greater than 255 should be replaced with 0 and 255 respectively.

The values v(i, j) are the now reconstructed image luminance values.

Discussion of Secondary Processes

It is usual to supplement the primary process with additional measures to improve compression or image quality.

After step (10), image accuracy can be improved by iterating through all pixel pairs V(8I+7, j), V(8I+8, j) and all pixel pairs V(k, 8J+7), v(i, 8J+8), that is to say adjacent pixels which were separated into separate image blocks) and respectively incrementing and decrementing their values v1, v2 by, for example (v2−v1) / max (2, 11 sqrt (M)) where M is the rate scaler used in step (4) and where the expression in the denominater is again just a convenient approximation to optimality.

Before performing step (6), the subjective difficulty of the local image area can be classified, perferentially into one of three types, single-, double-, or quadruple-precision with the code preface '0', '10', or '11 output respectively. The computation in step (6) is now replaced with $$L(i, j) = G(i, j) * K(i, j) * 2^{P - s(i, j)}$$

where p=0, 1 or 2 for single-, double-, and quadruple-precision respectively. This is later compensated in step (9.2) where the added precision must be removed with an (increased) right-shift.

Unfortunately no very effective simple classification scheme has been found. We currently use a cumbersome scheme which derives the difficulty measure P from four sources:

a) P_left and P_up, the difficulty measures of neighboring image areas, b) $sum(i+j)G(i,j)'2) / sum(G(i,j)'2$, the transform energy skew, c) $-G(0,0)$, the inverse mean luminance, and d) $max(sum_{13}over_{13}fixed_{13}width(Histogram(v(i,j))))$, the uniformity.

In step (7), the transform data L(,) to be stored or transmitted can be further reduced using an entropy encoding method. We use and recommend an elaboration of the CCITT zigzag-run-and-template code with several default Huffman tables depending on the bit rate. For definiteness we detail an example of such in the following section.

Example Compressed File Format

A compressed image is represented by

1) Preface (image width, height, rate scaler M, etc.)

2) Pixel Block 0
   Pixel Block 1
   Pixel Block 2
   ...
   Pixel Block $N - 1$ 3) Postface (if any)

where each Pixel Block is represented by
1) Precision Code (as determined by optional step Z)
2) DC Coefficient Delta Code
3) AC Coefficient Code (repeated zero or more times)
4) End-of-Block Code where each AC Coefficient Code is represented by
1) Nine-Zero Extension (Repeated E times, E 0)
2) Run-template code denoting (R,T)
3) Sign of Coefficient value (1 bit)
4) Absolute value of Coefficient with MSB deleted (T bits)

where R+ (*E is the number of zero-valued coefficients preceding this one in "zigzag" order (a sequence based on the sum i+j) and where T is the bit-position of the most-significant bit (MSB) of the absolute value of $$GCT\_16(a, b, c, e, f, g, h, r, s, t) =$$

$$\begin{vmatrix} GCT\_8(a, b, c, r) & GCT\_*(a, b, c, r) \\ GQ(e, f, g, h, r, s, t) & -GQ(e, f, g, h, r, s, t) \end{vmatrix}$$

where $GCT8(a, b, c, r) =$ $$\begin{vmatrix} 1 & 1 & 1 & 1 & 1 & 1 & 1 & 1 \\ 1 & -1 & -1 & 1 & 1 & -1 & -1 & 1 \\ b & 1 & -1 & -b & -b & -1 & 1 & b \\ b & 1 & -1 & -b & -b & -1 & 1 & b \\ a & ar+r & ar-r & 1 & -1 & r-ar & -r-ar & -a \\ 1 & -cr-r & cr-r & c & -c & r-cr & cr+r & -1 \\ c & r-cr & -cr-r & -1 & 1 & cr+r & cr-r & -c \\ 1 & r-ar & ar+r & -a & a & -r-ar & ar-r & -1 \end{vmatrix}$$

and where $GQ8(e, f, g, h, r, s, t) =$ $$\begin{vmatrix} e & es+t & rs(e-1)+rt(e+1) & r(e+1) & r(e-1) & rs(e+1)+rt(1-e) & -s+et & 1 \\ 1 & -s-ht & rs(h-1)+rt(-1-h) & r(h+1) & r(1-h) & rs(-1-h)+rt(1-h) & hs-t & h \\ g & s-gt & rs(-g-1)+rt(g-1) & r(-1-g) & r(1-g) & rs(g-1)+rt(g+1) & gs+t & 1 \\ 1 & -fs+t & rs(f+1)+rt(f-1) & r(-f-1) & r(f-1) & rs(f-1)+rt(-1-f) & -s-ft & f \\ f & s+ft & rs(f-1)+rt(-f-1) & r(1-f) & r(-f-1) & rs(-f-1)+rt(1-f) & -fs+t & -1 \\ 1 & -gs-t & rs(g-1)+rt(g+1) & r(g-1) & r(-1-g) & rs(g+1)+rt(1-g) & s-gt & -g \\ h & -hs+t & rs(-h-1)+rt(1-h) & r(h-1) & r(h+1) & rs(1-h)+rt(h+1) & -s-ht & -1 \\ 1 & s-et & rs(e+1)+rt(1-e) & r(1-e) & r(e+1) & rs(1-e)+rt(-1-e) & es+t & -e \end{vmatrix}$$

the coefficient, for example T=3 when the coefficient is 11 or −11: bit position: 876543210

11 = 000001011 (binary)
         ↑most significant bit

We will not detail a choice or encoding of the DC coefficient Delta, but we do give an example Huffman code useful at higher bitrates for the AC run-and-Template Codes.

| Code | R | T |
|---|---|---|
| 0xx | 0 | w |
| 100x | 0 | 4+w |
| 111110 | 0 | 6 |
| 1111110{0} | 0 | 7+n |
| 1010 | 1 | 0 |
| 10110 | 1 | 1 |
| 10111 | 2 | 0 |
| 1100xx | 1+w | max(0,2−w) |
| 11010{0}1xx | 1+w | n+1+max(0,2−w) |
| 11011xx | 5+w | 0 |
| 111100{0}>1xx | 1+w | n+1+max(0,2−w) |
| 11011xx | 5+w | 0 |
| 111100{0}>1xx | %+w | 1+n |

| 1111111 | = Reserved |
|---|---|
| 111101 | = Nine-Zero Extension |
| 1110 | = End-of-Block Code |
| where {0} | denotes n consecutive zeros, n=0, 1,2,3... |
| xx | denotes 2 bits interpreted as w=0,1,2, or 3 |
| x | denotes 1 bit interpreted as w=0 or 1 |

128-Point and 256-Point Transforms

The foregoing method can be used with a larger Generalized Chen Transform, 8-by-16 or 16-by-16. The method for further generalizing Chen's Transform should be clear upon noting that the 1D 16-point GCT is given (with the rows in "butterfly order" and without the necessary normalizing post-multipliers) by Here, the "true cosine" parameters are $g =$ tangent $15pi/32 \approx = 10.1532$ $a =$ tangent $14pi/32 \approx = 5.0273$ $f =$ tangent $13pi/32 \approx = 3.2966$ $b =$ tangent $12pi/32 \approx = 2.4142$ $g =$ tangent $11pi/32 \approx = 1.8709$ $c =$ tangent $10pi/32 \approx = 1.4966$ $h =$ tangent $9pi/32 \approx = 1.2185$ $r =$ cosine $8pi/32 \approx = 0.7071$ $t =$ cosine $12pi/32 \approx = 0.3827$ $s = \text{cosine } 4pi/32 \approx = t * b$ The parameters we use are $e = 10$ $a = 5$ $f = 3.25$ $b = 2.4$ $g = 1.875$ $c = 1.5$ $h = 1.25$ $r = 17 / 240.708333$ $r = 17 / 240.708333$ $t = 5 / 13 \approx = 0.384615$ $s = t * b = 12/13$ The inverse of GQ8(e, f, g, h, r, s, t) is the transpose of GQ8 (e, f, g, h, ½r, t' b, t') where $b = s / t$ $t' = 1 / (t + t*b*b)$ Example Matrices Transpose of the Matrix TP

| The Cosine Transform (a = 5.02734 b = 2.41421 c = 1.49661 r = 0.70711): | | | | | | | |
|---|---|---|---|---|---|---|---|
| 0.1768 | 0.1768 | 0.1768 | 0.1768 | 0.1768 | 0.1768 | 0.1768 | 0.1768 |
| 0.2452 | 0.2079 | 0.1389 | 0.0488 | −0.0488 | −0.1389 | −0.2079 | −0.2452 |
| 0.2310 | 0.0957 | −0.0957 | −0.2310 | −0.2310 | −0.0957 | 0.0957 | 0.2310 |
| 0.2070 | −0.0488 | −0.2452 | −0.1389 | 0.1389 | 0.2452 | 0.0488 | −0.2079 |
| 0.1768 | −0.1768 | −0.1768 | 0.1768 | 0.1768 | −0.1768 | −0.1768 | 0.1768 |
| 0.1389 | −0.2452 | 0.0488 | 0.2079 | −0.2079 | −0.0488 | 0.2452 | −0.1389 |
| 0.0957 | −0.2310 | 0.2310 | −0.0957 | −0.0957 | −0.2310 | −0.2310 | 0.0957 |
| 0.0488 | −0.1389 | 0.2079 | −0.2452 | 0.2452 | 0.2452 | −0.2079 | 0.1389 |
| Related Chem Transform (a = 5.0 b = 2.4 c = 1.5 r = 0.7) | | | | | | | |
| 0.1768 | 0.1768 | 0.1768 | 0.1768 | 0.1768 | 0.1768 | 0.1768 | 0.1768 |
| 0.2451 | 0.2059 | 0.1373 | 0.0490 | −0.0490 | −0.1373 | −0.2059 | −0.2451 |
| 0.2308 | 0.0962 | −0.0962 | −0.2308 | −0.2308 | −0.0962 | 0.0962 | 0.2308 |
| 0.2080 | −0.0485 | −0.2427 | −0.1387 | 0.1387 | 0.2427 | 0.0485 | −0.2080 |
| 0.1768 | −0.1768 | −0.1768 | 0.1768 | 0.1768 | −0.1768 | −0.1768 | 0.1768 |
| 0.1387 | −0.2427 | 0.0485 | 0.2080 | −0.2080 | −0.0485 | 0.2427 | −0.1387 |
| 0.0962 | −0.2308 | 0.2308 | −0.0962 | −0.0962 | 0.2308 | −0.2308 | 0.0962 |
| 0.0490 | −0.1373 | 0.2059 | −0.2451 | 0.2451 | −0.2059 | 0.1373 | −0.0490 |

Description of Apparatus

Now that a detailed discussion of the present invention has been provided, apparatus incorporating aspects of the present invention will now be described.

Though the following, "point" is used to denote a scaler register or data path of arbitrary precision, typically 8 to 12 bits. A method for determining appropriate precision is known [6].

In the software method, transform stages are combined and the Wu-Paolini enhancement was adopted. For the semiconductor apparatus, it is more convenient simply to provide two 8-point transform units, one each for the vertical and horizontal senses.

It is necessary to provide a 64-point shift array between the vertical and horizontal transforms, and similar buffering between the transform section and the coding section.

Figure 2B:
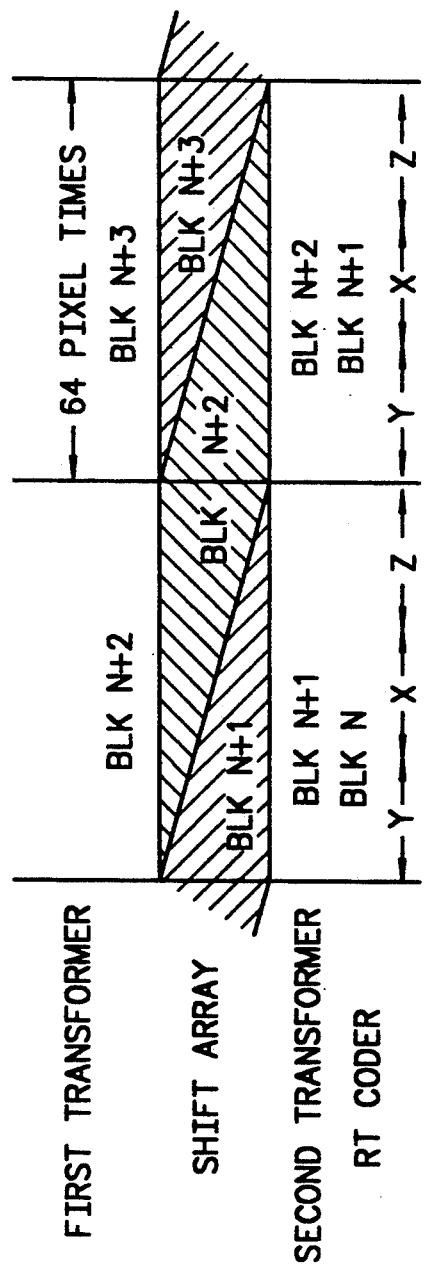
Figure 2C:
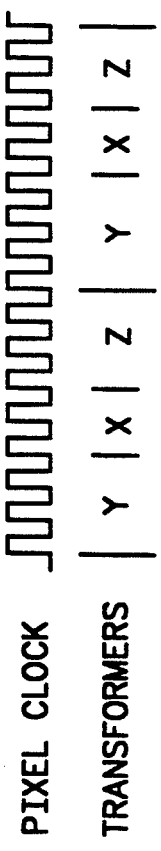

Although the present invention includes a monochromatic apparatus and/or separate apparatuses for compression and decompression, a preferred embodiment (FIG. 7) includes both a compressor (FIG. 1a) and decompressor (FIG. 1b) which operate on tricolor data. Data is admitted to the compressor (FIG. 2a) in vectors of 8 pixels which are further arranged in a lexicographic order into blocks of 64 pixels. Processing of blocks is pipelined (FIG. 2b).

A pixel input to the compressor comprises "R" (red); "G" (green) and "B" (blue) scalers. These are immediately transformed to a luminance-chrominance space. (The reasons for such a transform are well known.)

Figure 3A:
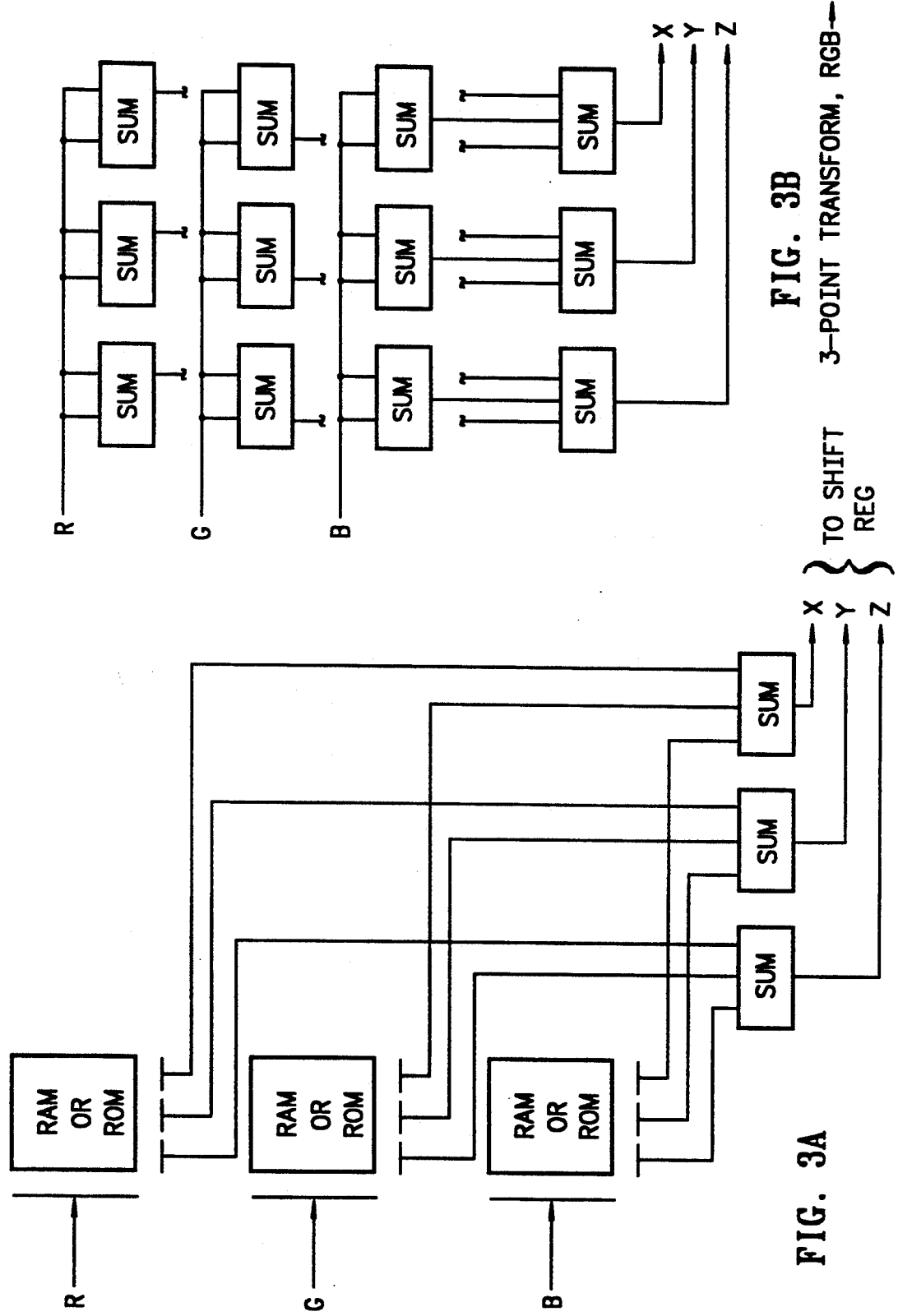

The transform can use arbitrary fixed or programmable coefficients (FIG. 3a) or can be "hard-wired" to simple values in a dedicated application (FIG. 3b). The transform space is denoted here as XYZ, but any linear form of the tricolor input may be used, perhaps the CCITT standard: (Y, R-Y, B-Y). The three values X, Y and Z are then each, in effect, delivered to separate monochrome compressors. The decompressor uses the same or similar circuitry as in FIG. 3, except that now an XYZ vector is transformed to an RGB vector.

Figure 5:
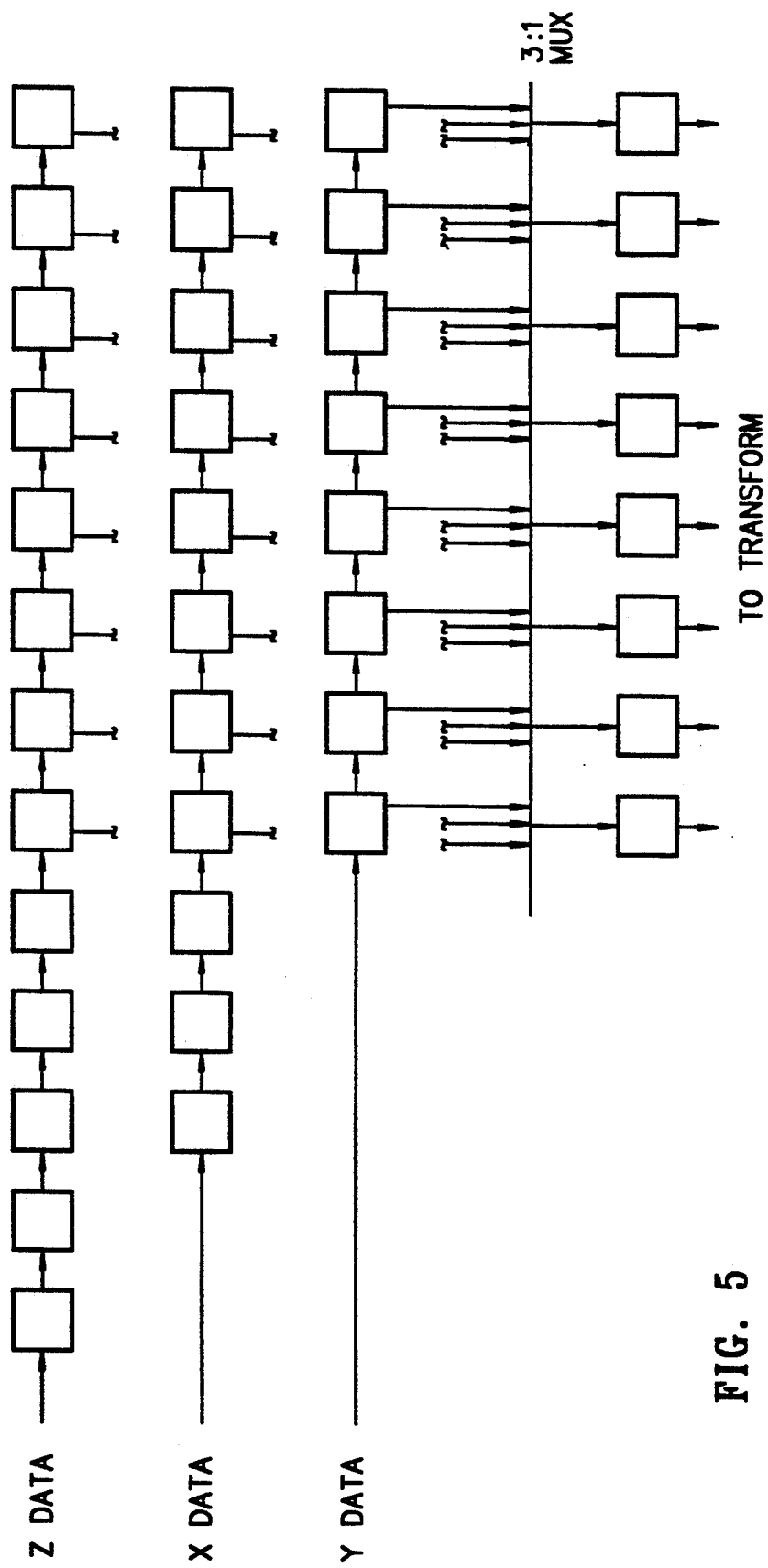
FIG. 5 shows a diagram of a shift register utilized with the present invention.

The values Y, X and Z are then input to three shift registers (FIG. 5) to await delivery to the first transform unit. The transform unit operates in 2.6 pixel times, so some of the data much be delayed as shown. The labeling "XYZ" is a bit unfortunate; optimized coding methods require that luminance ("Y") be processed first.

During decompression, the XYZ skew problem is reversed. Note that 5 points of registers are saved in the preferred embodiment by reversing the usage of Y- and Z- shift registers during decompression.

Referring to FIG. 1a, the major divisions of the compressor include an input section (1, 2) which transforms the input to XYZ space and buffers it for subsequent transfer to the transform unit (3). For each eight pixel times, the transform 1 unit must be cycled three times (once for each of X, Y and Z data). The output of transform 1 is placed into the shift array (4) where it is retained until the 8×8 pixel block has been completely read. The transform 2 unit (5, 6) operates on the previously read pixel block, again cycling three times in each eight pixel times, and provides data to the Coder Input Buffer (7, 8). The Coder (9,10,11) is also shared among the three color coordinates, but an entire luminance block will be coded without interruption, followed by each of the chrominance blocks. If the processing of these three blocks cannot be completed within 64 pixel times, timing and control logic will hold up the pixel clock to the external input circuitry.

The storage areas (Input Shift Register [2], Shift Array [4], and Coder Input Buffers [7,8]) must be triplicated for the three colors, but the computation units [3,5,6,9,10,11] are shared (time-multiplexed) among the Y-, X- and Z-data.

The Coder [9,10,11], the Coder Input Buffer [7,8], code programming [12,13,14] and timing and control logic [not shown] may follow existing art or practice. Similarly, the method for time-multiplexing three colors through a single circuit is well known. The 3-point transform section [1] (FIG. 3) and Shift Registers [2] (FIG. 5) are also known.

The scaler [6] uses a programmed RAM or ROM and a system of (implicit) shifting, multiplexers and adders. This has a straightforward realization. Given the definition of the Generalized Chen Transform and the appropriate parameters, design of the 8-Point Transformer (FIG. 8) is also straightforward.

The Shift Array (FIG. 6A) merits special discussion. Vertical (transformed) vectors from the current input pixel block are assembled while horizontal vectors from the previous pixel block are delivered to the horizontal transformer. Without special design, this would require 128 registers (64 for each of the current and previous block) since the points are used in an order different from the order received. However, this need is eliminated by shifting the data left-to-right during even numbered pixel blocks and top-to-bottom during odd-numbered pixel blocks.

The described shift array is two-directional. A four-directional shift array is preferred in some embodiments.

Figure 6A:
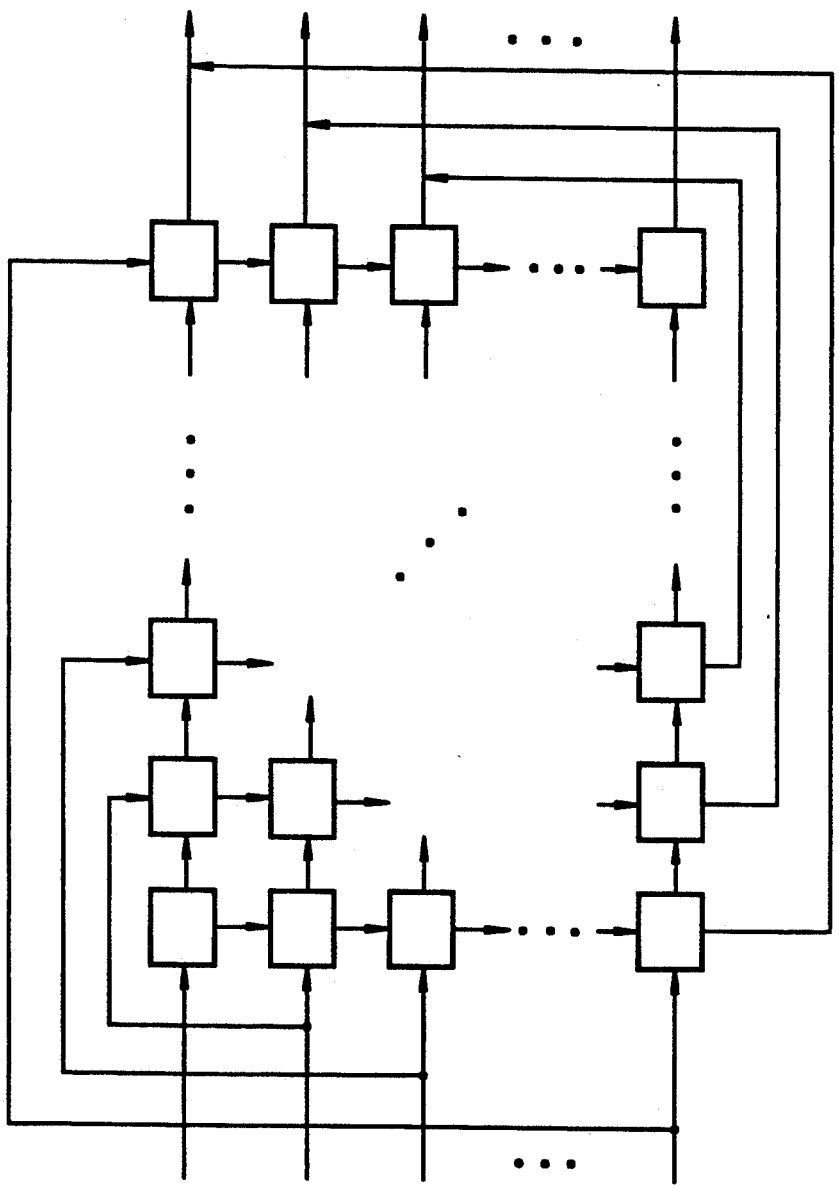
FIG. 6A shows a diagram of a shift array according to the present invention.
Figure 6B:
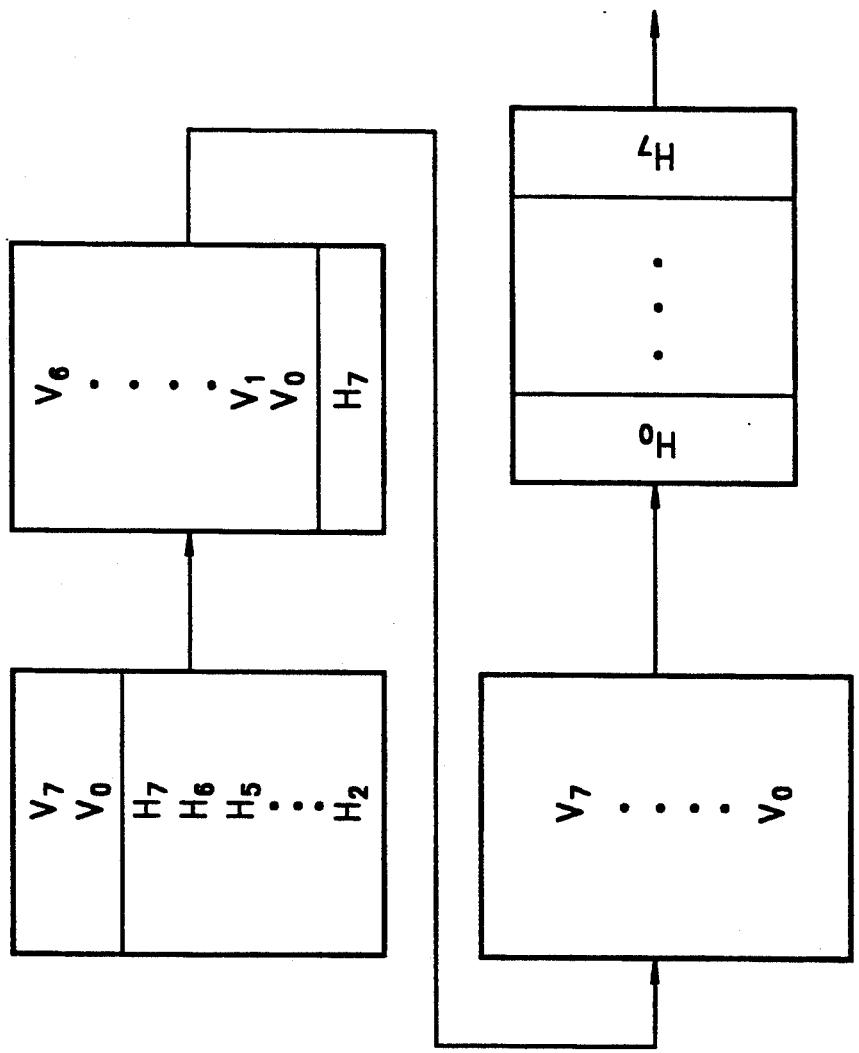
FIG. 6B shows an example of the shift array of FIG. 6A.

FIG. 6B shows in more detail the shift array aspect of FIG. 6A. In FIG. 6B, vectors are removed from the shift array at the bottom, one by one, and sent to the DCT8 section of FIG. 1A. In the meantime, vertical vectors from the other DCT8 section are being input to the shift array at the top. Gradually, the old vectors are removed form the shift array and the shift array will completely fill up with vertical vectors from the next pixel block.

For the next pixel block, the direction of data flow will now be 90 degrees different from the direction of data flow in a previous pixel block. In that way, the horizontal vectors will be removed at the right of the shift array and sent to the DCT8 and new vertical vectors will come in at the left. Going on to block N+2, another 90 degree rotation reverts back to the original form, and so on.

The decompressor (FIG. 1b) has a structure quite similar to the compressor (FIG. 1a) except that the direction of data flow is reversed. In a preferred embodiment, a single apparatus operates in two modes, either as a compressor or a decompressor.

Figure 4:
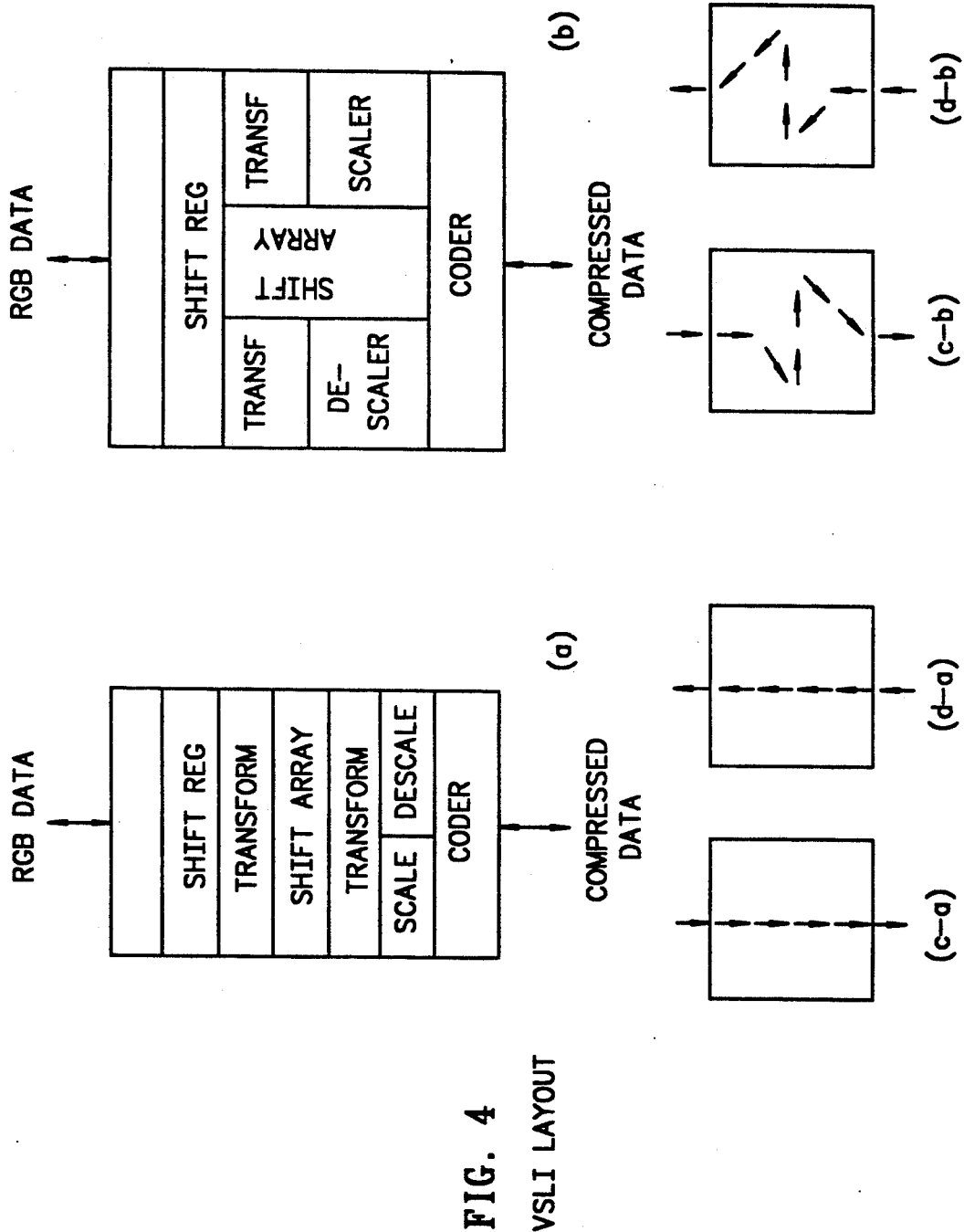
FIGS. 4A and 4B show possible VLSI layouts according to the present invention.

Possible VLSI layouts (FIGS. 4a, 4b) lead to different data flows for compression (FIGS. 4c-a,b) and decompression (FIGS. 4d-a,b). Note that the operation of the transform and shift array units has the same directional sense for both compression and decompression in one layout (FIG. 4b) but not the other (FIG. 4a). This is seen more clearly when the combined compressor/decompressor data flow (FIG. 7) is considered. When the two transform units are associated (FIG. 4a) with RGB and compressed data respectively, layout difficulties result unless a four-directional shift array is used.

Hence, we associate (FIG. 4b) with the two transform units respectively with the input and output sections of the shift array.

Figure 8B:
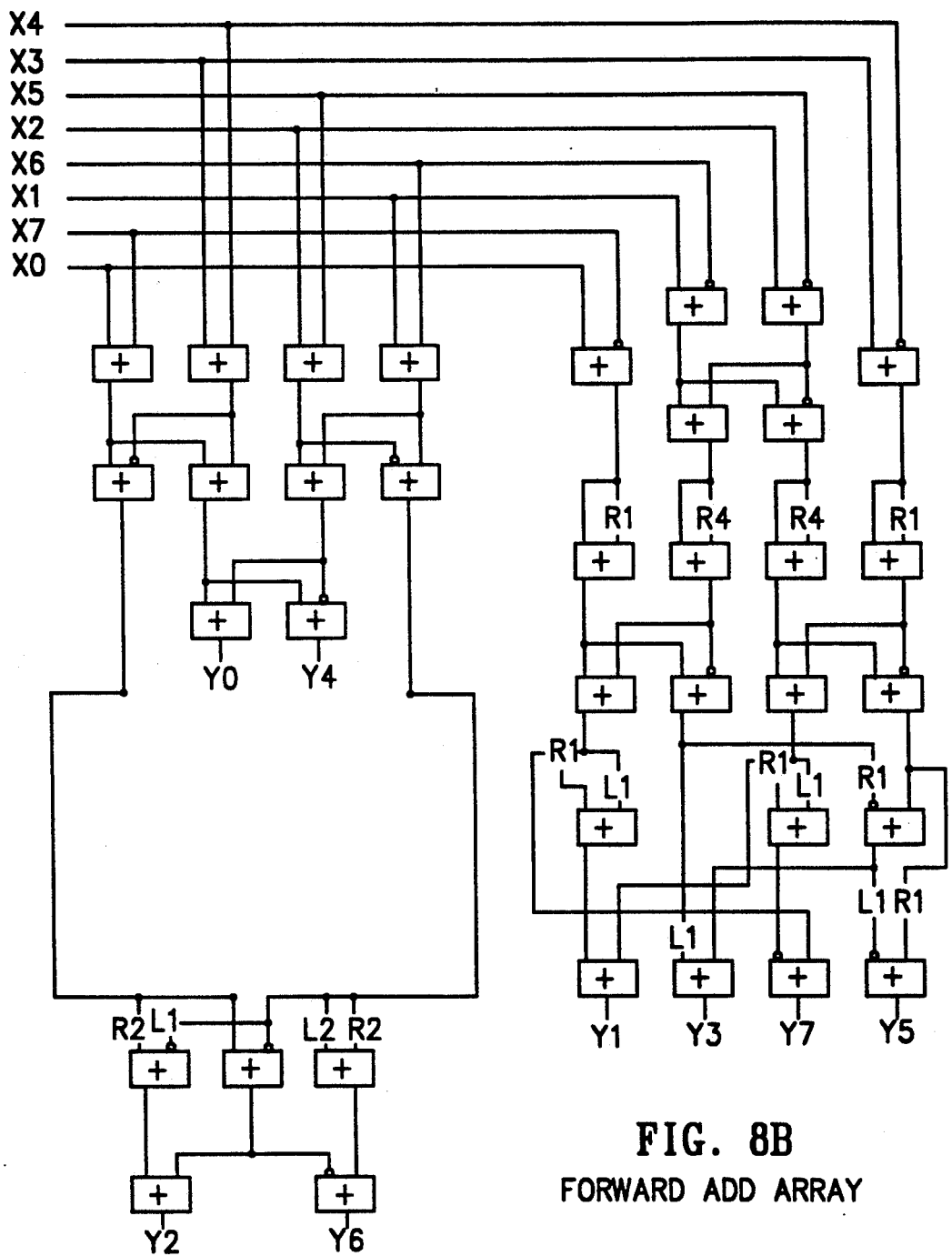

In one embodiment, the transform unit used in the compressor (FIG. 8A) utilizes 38 adders. Shifting right by one ("R1"), two ("R2") or four ("R4") positions, or left by one ("L1") position is done easily. The circuit depicted uses the parameters $(a,b,c,r)=(5, 2.4, 1.5, 17/24)$. A realization with $b=2.5$ would require only 36 adders in another embodiment (FIG. 8B).

A related circuit is required for the inverse transform unit in the decompressor. With careful use of 'output enable' signaling, it is possible to reuse most of the adders in the forward transformer. The realization of this is straightforward for someone skilled in the art.

The scaler uses a programmed RAM or ROM, and a system of implicit shifting, multiplexers and adders. This has a straightforward realization.

The descaler can be realized in various ways, preferably a small hardwired multiplier with RAM, accumulator, timing and control logic and small timeplate cutoff. In a dedicated low-cost application, the descaler can be simplified by noting that deblurring weights are near-optimal across a broad range; hence, simple scaling can be used as in the scaler.

Figure 7:
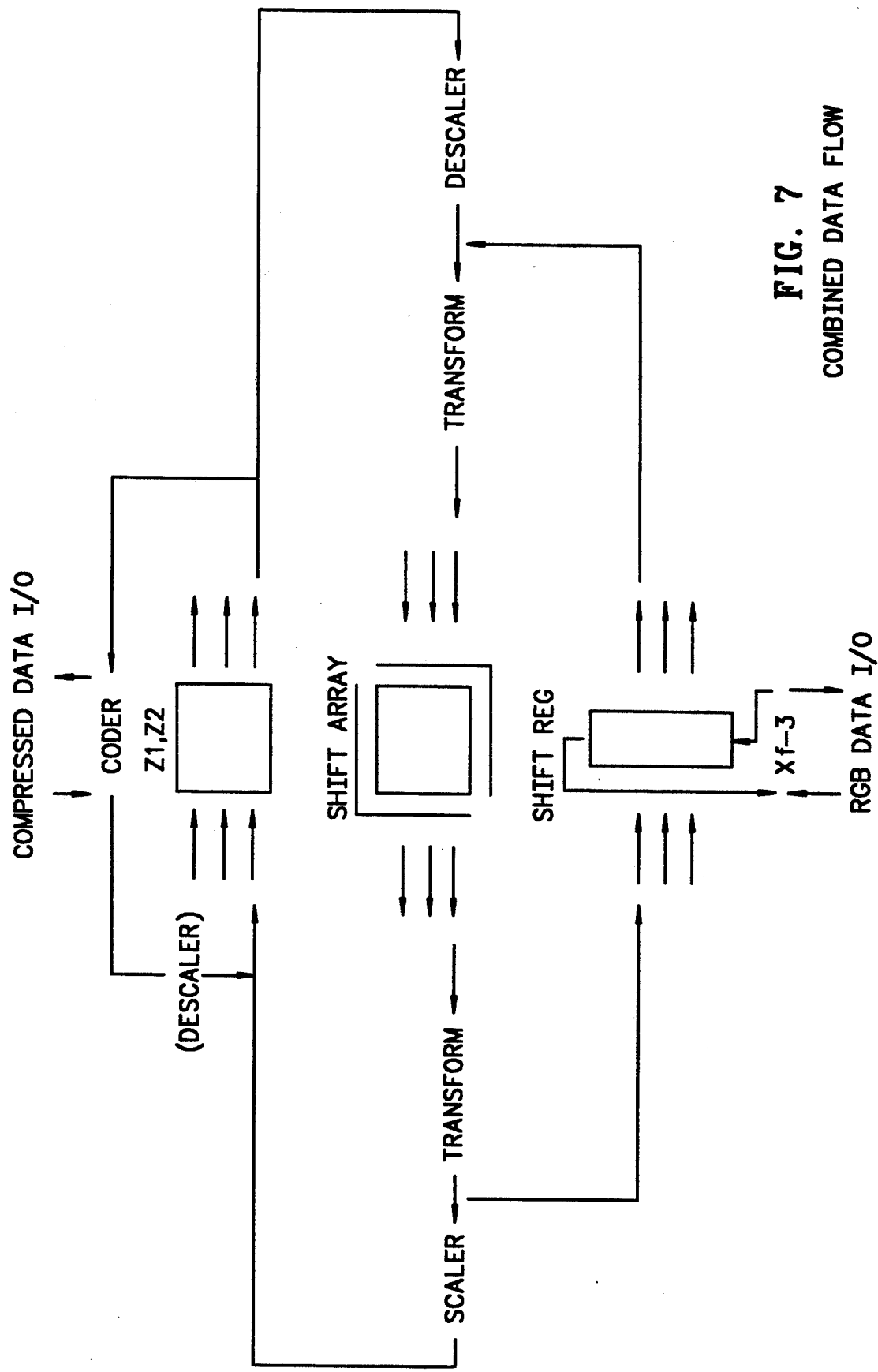
FIG. 7 shows a diagram of combined data flow.

The descaler can be located either between the coder and its output buffer, or between the output buffer and a transformer, as indicated in FIGS. 1 and 7.

The coder input buffer can be realized in various ways, including a cycle-sharing register reduction arrangement similar to the shift array. A more straightforward design uses 384-by-10 bit RAM with a 64-by-7 bit ROM to provide the RAM addresses.

An example of a cycle of operation will now be described in connection with FIGS. 1A and 1B.

In FIG. 1A, data enters the compressor as tri-color information, red, green and blue. It is immediately transformed to an alternate space, called XYZ. The three elements, X, Y and Z, each enter their own shift register.

From the shift register (Step 2) they go to an 8-point DCT unit. There could either be one 8-point DCT unit, which is multiplexed among the three colors, X, Y and Z, or they could each have their own individual DCT 8-unit.

Information then enters the 64-point shift array (4). There is an individual shift array for each color. From the shift array, block 4, it goes to another DCT unit, block 5, which is similar to block 3. The information then has to be scaled, which is an additional layer of added shift.

The information is only transformed both horizontally and vertically. The shift array actually conceptually rotates the data 90 degrees, so that it can now be transformed in the other direction. After the data is scaled, it goes into another buffer, denoted blocks 7 and 8 (Z1 and Z2) to hold the data so that it can eventually be encoded and output from the chip (Z1, Z2 equals zigzag).

Conceptually, this is like the shift array, block 4, except now the data is not being rotated 90 degrees. Instead, it is being transmuted into the zigzag order, which is traditionally being used for these things, and is used by the CCITT standard. The information is then presented to the run and template control unit block 9, which will detect zeros and create runs for the zeros, detect non-zeros and an estimate of the logarithm of the value, which is called the template. The combination run and template is looked up in a RAM or ROM, called the RT code, and is then output from the chip.

The mantissa, which is the significant bits of the transfer coefficients, are also output from the chip. Since the mantissa and run and template code will be arbitrarily long, one bit, two bit, whatever, and the output from the chip will always be 16 bits, or 8 bits, 32 bits, whatever, block 11 (alignment) facilitates that.

The other blocks shown in FIG. 1A (optional) programming blocks 12, 13 and 13, which respectively allow you to set an arbitrary RGB to XYZ transform, arbitrary rate scalers and psychoadaptive weights, and an arbitrary modified Huffman code for the run and template.

FIG. 1B is very similar to 1A. The run and template code now has to be decoded into a run and template combination and the necessary number of zeros has to be omitted.

In FIG. 1A, the scaler is a simple array of adders and shifters. In FIG. 1B, the descaler is implemented as a very small multiply in hardware.

Figure 9:
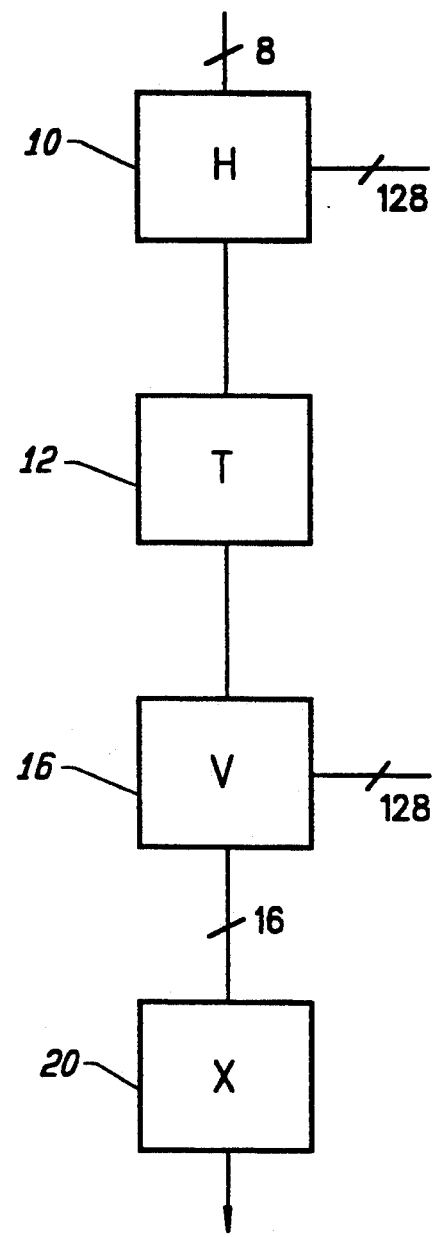
FIG. 9 shows a diagram for two dimensional generalized Chen transform according to the present invention.

FIG. 9 shows a diagram for two-dimensional generalized Chen transform. Pixels come in at the top and are typically 8 bits wide. The pixels pass through a wide array of adders in the horizontal transform 10 with a data width of typically 128 bits. The output from the horizontal transform 10 passes through a transposition RAM 12 for rotating the information from horizontal to vertical. The data then passes into the vertical transform 16 which again comprises only adders (typically 128 bits wide). The output coefficients are finally reduced to a width of roughly sixteen bits and pass through a single multiplier 20, which according to the present invention is JPEG compatible.

Figure 10:
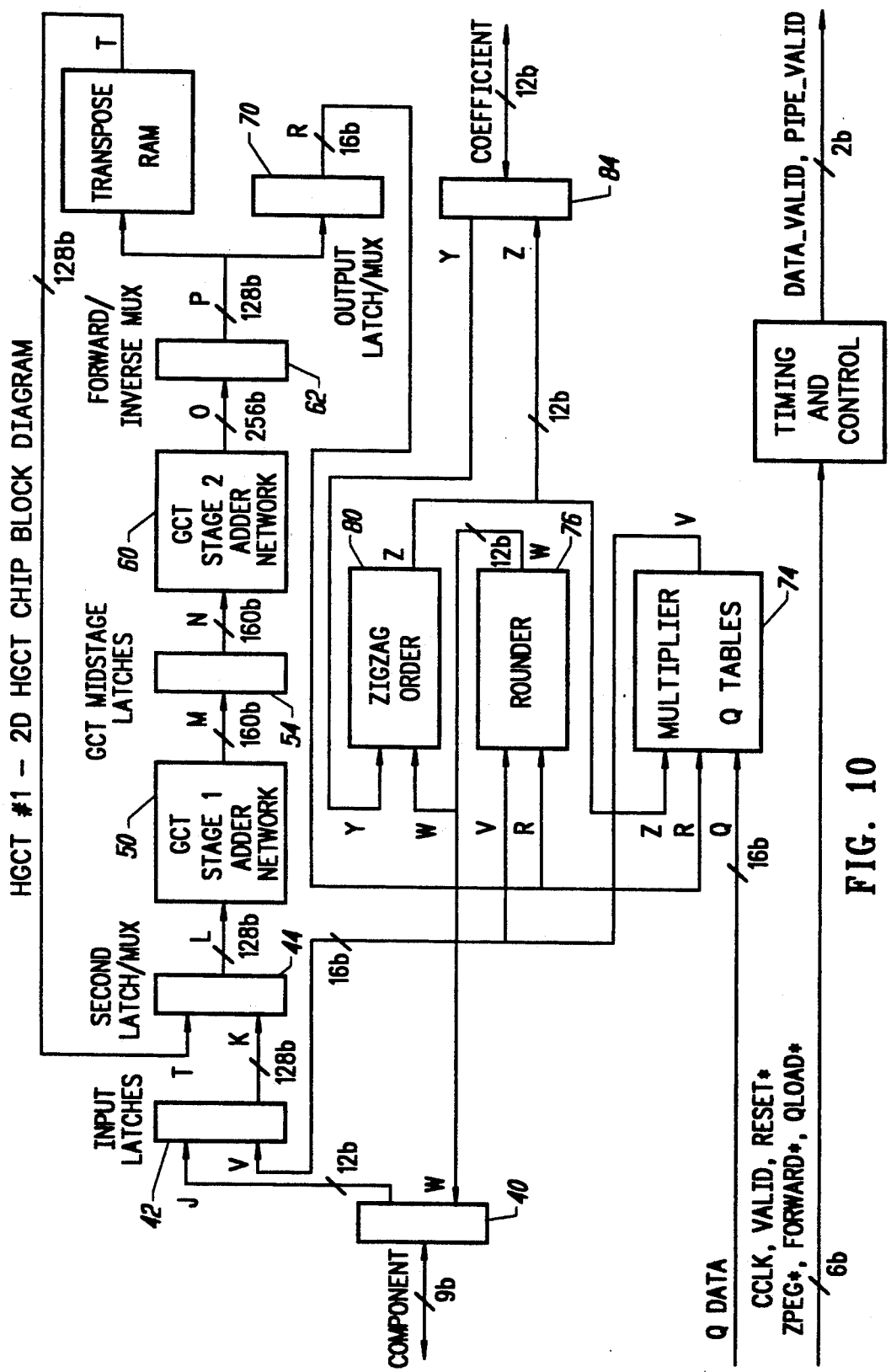
FIG. 10 shows a block diagram of a preferred embodiment of the present invention.

FIG. 10 shows a block diagram for a VLSI implementation according to the present invention. In FIG. 10, data comes in at component 40 and is latched into the input latch 42, pass through multiplexer 44 into the first half of the GCT transform 50 (which is an adder network). The second half of the adder network 60 is to the right of the midstage latches 54. The output is passed through MUX 62 to the transposition RAM 66 where the horizontal to vertical transformation is made.

The output of the transposition RAM 66 is fed back round to the first stage of the GCT 50 in order to form the first half of the vertical transform in a time sharing or time slicing arrangement.

The output of GCT 50 is fed to the input of the second stage of the vertical transform 60. Finally, the output of GCT 60 is taken through the output latch multiplexer 70 and is passed through Multiplier 74 and Rounder 76 to the zigzag order-arranger 80, the output of which is passed out as a twelve bit coefficient 84.

Still referring to FIG. 10, the inverse transformation process according to the present invention will now be described briefly:

In FIG. 10, the 12 bit coefficients are input through Block 84 to the Y input of the Zigzag Order 80. The output of Zigzag Order 80 goes through Multiplier 74 and Rounder 76 which performed an inverse quantization process similar to that performed in the forward process. The output of Multiplier 74 is input to Latch 42 which is the first stage of the inverse transformation process.

From Latch 42, the inverse transformation process follows the same two stage time multiplex path that the forward process followed. The outputs appear at the Output Latches 70 the output of which are pixels that are rounded by Rounder 76, whose output is fed to Block 40 for output.

The foregoing description of the preferred embodiment of the invention has been presented for purposes of illustration and description. It is not intended to be exhaustive or to limit the invention to the precise form disclosed, and many modifications and variations are possible in light of the above teaching. Also, the present invention is compatible with existing standards, such as JPEG. The preferred embodiment was chosen and described in order to best explain the principles of the invention and its practical applications to thereby enable others skilled in the art to best utilize the invention and various embodiments and with various modifications as are suited to the particular use contemplated. It is intended that the scope of the invention be defined only by the claims appended hereto.

References

[1] Acheroy, M. "Use of the DCT for the restoration of an image sequence", SPIE vol 593 Medical Image Processing (1985)

[2] Cooley, and Tukey, J. W., "An algorithm for (fast) Fourier series", _Math Comput_, XIX No 90, pp 296–301, 1965.

[3] Chen, W. et al, "A fast computational algorithm for the DCT", IEEE Trans. Commun. vol COM-25 (1977)

[4] Wu, H. R. and Paolini, F. J., "A 2D Fast Cosine Transform", IEEE Conf. on Image Processing, vol I (1989)

[5] Lee, B. C., "A Fast Cosine Transform", IEEE ASSP, vol XXXIII (1985)

[6] Jalali and Rao, "Limited Wordlength and FDCT Processing Accuracy," IEEE ASSP-81, Vol. III, pp. 1180-2.

[7] Wu, H. R. and Paolini, F. J., "A Structural Approach to Two Dimensional Direct Fast Discrete Cosine Transform Algorithms", International Symposium on Computer Architecture and Digital Signal Processing, Hong Kong, Oct 1989.

What is claimed is:

1. An image compressor comprising
   horizontal transform means for receiving input pixels having a certain bit width and for horizontally transforming said input pixels using only a first adder array,
   transposition memory means for rotating the horizontally transformed pixels to vertical,
   vertical transform means for receiving the vertical pixels and for vertically transforming the vertical pixels using only a second adder array, and
   a single multiplier for receiving the transformed vertical pixels and for performing a single multiplication function on said transformed vertical pixels to provide compressed pixel data representative of said input pixels.

2. An image compression system comprising
   means for receiving input image pixel data representative of an image,
   Generalized Chen transform (GCT) means for compressing said image data, said GCT means including
   a GCT adder for horizontally transforming said image data using only adders,
   transportion memory means for rotating the horizontally transformed pixels to vertical, said GCT adder including means for vertically transforming the vertical pixels using only said adders, and a single multiplier for performing a multiplication function on said transformed vertical pixels to provide compressed pixel data representative of said input pixels.

3. An image compression system as in claim 2 wherein said GCT adder includes a first GCT adder network stage for transforming the first half of said horizontal and vertical transformations and a second GCT adder network stage for transforming the second half of said horizontal and vertical transformations.

4. An image compression system as in claim 3 wherein said single multiplier include zigzag order means.

5. An image compression system as in claim 3 wherein said single multiplier include rounder means.

6. An image compression system as in claim 4 wherein said single multiplier includes a multiplier table.

7. An image compressor comprising transform means for receiving input pixels having a certain bit width and for horizontally or vertically transforming said input pixels using only a first adder array, transposition memory means for rotating the horizontally or vertically transformed pixels to vertical or horizontal, said transform means for receiving the vertical or horizontal pixels and means for vertically or horizontally transforming the vertical or horizontal pixels using only said first adder array, and a single multiplier means for receiving the transformed pixels and for performing a single multiplication function on said transformed pixels to provide compressed pixel data representative of said input pixels.

* * * * *